(12) United States Patent
Inanami et al.

(10) Patent No.: US 7,102,147 B2
(45) Date of Patent: Sep. 5, 2006

(54) CHARGED PARTICLE BEAM EXPOSURE METHOD AND METHOD FOR PRODUCING CHARGED PARTICLE BEAM EXPOSURE DATA

(75) Inventors: Ryoichi Inanami, Yokohama (JP); Shunko Magoshi, Yokohama (JP); Atsushi Ando, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/255,830

(22) Filed: Sep. 27, 2002

(65) Prior Publication Data

US 2003/0160192 A1    Aug. 28, 2003

(30) Foreign Application Priority Data

Sep. 27, 2001 (JP) ............................ 2001-298636
Feb. 22, 2002 (JP) ............................ 2002-046919

(51) Int. Cl.
    *H01J 37/08* (2006.01)
(52) U.S. Cl. .................. 250/492.23; 250/492.22; 250/492.2
(58) Field of Classification Search ............ 250/492.23
    See application file for complete search history.

(56) References Cited

U.S. PATENT DOCUMENTS

| | | | |
|---|---|---|---|
| 5,334,282 A * | 8/1994 | Nakayama et al. | 430/296 |
| 5,384,466 A * | 1/1995 | Nakamura et al. | 250/492.22 |
| 5,404,018 A * | 4/1995 | Yasuda et al. | 250/492.22 |
| 6,088,519 A * | 7/2000 | Koford | 716/9 |
| 6,137,113 A * | 10/2000 | Muraki | 250/492.22 |
| 6,495,841 B1 * | 12/2002 | Ando et al. | 250/492.23 |
| 2001/0025931 A1 * | 10/2001 | Takamatsu et al. | 250/491.1 |
| 2003/0028407 A1 * | 2/2003 | Ibaraki et al. | 705/7 |
| 2003/0094584 A1 * | 5/2003 | Yui et al. | 250/492.22 |

FOREIGN PATENT DOCUMENTS

| | | |
|---|---|---|
| JP | 07-134393 | 5/1995 |
| JP | 2000-235946 | 8/2000 |
| JP | P2000-235946 A | 8/2000 |
| JP | 2001-257145 | 9/2001 |
| JP | P2001-257145 A | 9/2001 |

* cited by examiner

*Primary Examiner*—Nikita Wells
*Assistant Examiner*—Phillip A. Johnston
(74) *Attorney, Agent, or Firm*—Finnegan, Henderson, Farabow, Garrett & Dunner, L.L.P.

(57) ABSTRACT

Provided is a charged particle beam exposure method placing an mask having openings in an exposure apparatus that including a deflector which deflects a charged particle beam on the mask, applying a first voltage to the deflector, the first voltage deflects the beam at an first opening, sequentially exposing all the character patterns which can be exposed by the beam shaped by the first opening after a stabilization time set as a function of a voltage has elapsed after applying the first voltage, applying a second voltage to the deflector after all the character patterns have been exposed by the beam shaped by the first opening, the second voltage deflects the beam at a next opening, and exposing all the character patterns which can be exposed by the beam shaped by the next opening after the stabilization time has elapsed after applying the second voltage.

33 Claims, 13 Drawing Sheets

500: Frame  417: Samle

CHARGED PARTICLE BEAM EXPOSURE METHOD AND METHOD FOR PRODUCING CHARGED PARTICLE BEAM EXPOSURE DATA

CROSS-REFERENCE TO RELATED APPLICATIONS

This application is based upon and claims the benefit of priority from the prior Japanese Patent Applications No. 2001-298636, filed Sep. 27, 2001; and No. 2002-46919, filed Feb. 22, 2002, the entire contents of both of which are incorporated herein by reference.

BACKGROUND OF THE INVENTION

1. Field of the Invention

The present invention relates to a charged particle beams exposure method and a method for producing charged particle beam exposure data for the purpose of throughput improvement when a pattern is transferred by charged particle beam exposure.

2. Description of the Related Art

Exposure of a circuit pattern of a semiconductor device using electron beam (EB) lithography technique does not require providing a mask required for exposure in photolithography, and is suitable to produce a fine pattern. However, in a variable shaping beam (VSB) scheme for dividing a pattern to be exposed into fine rectangles, thereby sequentially exposing, the number of shots is increased, and throughput is degraded. In contrast, a character projection (CP) scheme for exposing repetition patterns of some microns (characters) is introduced, thereby making it possible to restrict division into fine rectangles, and reduce the number of shots.

In exposure of a circuit pattern of a semiconductor device using an electron beam exposure apparatus as shown in FIG. 22, a pattern to be exposed is divided into fine basic patterns, and exposure of the fine patterns is repeated at the corresponding positions on a sample, thereby forming a pattern. Hereinafter, a description will be given in more detail.

An electron beam 401 emitted from an electron gun 400 is adjusted in current density by a condenser lens 402, and a first shaping aperture mask 406 is uniformly illuminated. In order to prevent irradiation into a area in which no electron beam is irradiated, a deflection voltage is applied from a blanking amplifier 403 to a blanking deflector 404, whereby the electron beam 401 is deflected, and is interrupted by a blanking aperture mask 405.

The electron beam 401 shaped in rectangle by means of the first shaping aperture mask 406 is formed as an image on a second shaping aperture mask 410 by a projecting lens 407. At this time, from a shaping deflection amplifier 408, the deflection voltage corresponding to the deflection quantity of the electron beam 401 is applied to a shaping deflector 409, whereby the electron beam is formed in a desired shape. Methods for shaping the electron beam 401 include a variable shaping beam (VSB) scheme and a character projection (CP) scheme.

In the VSB scheme, a pattern is exposed after being divided into a basic pattern of rectangle of a maximum beam size or less. The beam irradiation position is shifted relevant to a opening for VSB of the second shaping aperture mask 410, whereby a rectangular beam of its arbitrary size is shaped, and each pattern divided by using the shaped pattern is exposed.

In the CP scheme, a character of its size equal to or smaller than the maximum beam size is extracted from the pattern, and a character shaped opening is located at the second shaping aperture mask 410. A plurality of characters can be used, a beam is deflected and irradiated to a desired opening of the character shaped openings located in plurality, wherein character shaped basic patterns are exposed in all.

The shaped electron beam 401 is reduced by a reduction lens 411, and is formed as an image on a sample 417 by using an objective lens 414. At this time, the electron beam 401 is deflected by means of a main-deflector 416 to which a deflection voltage is applied from a main-deflection amplifier 415 and a sub-deflector 413 to which a deflection voltage is applied from a sub-deflection amplifier 412, whereby the deflected beam is irradiated to a desired position of the sample 417.

This procedure is repeated until all the divided patterns have been exposed. This single electron beam exposure is referred to as a "shot". In order to carry out an electron beam shot, as described previously, at least four deflectors 404, 409, 413, and 416 are used, and voltages to be applied to these deflectors each must be changed in response to each shot.

FIG. 23 shows a relationship between a distance when a voltage is applied to a shaping deflector to move the irradiation position of the electron beam on the second shaping aperture mask and a time for its deflection voltage to be stabilized. In the case where the electron beam is significantly deflected, the corresponding large voltage is applied to the deflector. If the large voltage is applied, when the same deflection amplifier is used, a time for a voltage value to be stabilized is extended. In FIG. 23, the deflection voltage is obtained as a relationship of $V_1=2V_2$, and a time for these voltages to be stabilized is obtained as a relationship of $t_1=2t_2$.

That is, when the deflection quantity of electron beam increases, a large voltage is applied to the deflector, and a waiting time for the beam to be stabilized is extended as well. This waiting time is referred to as a "stabilization time".

In the current electron beam exposure apparatus, the stabilization time when the maximum voltage is applied to the deflector is defined as a reference, and a stabilization time is made identical to another irrespective of the deflection voltage value.

From among these deflectors, a description will be given with respect to a main-deflector and a sub-deflector. FIG. 24A to FIG. 24C each show an exposure method using these deflectors. The sample 417 is placed on a stage (not shown), and an electron beam is irradiated while the stage moves continuously or stepwise. A unit in which this sample 417 is moved by the stage is referred to as a "frame". As shown in FIG. 24A, a frame 500 is set in a piece shape relevant to the sample 417. That is, the sample 417 is exposed while it is moved by the stage for each frame 500.

Each frame is further exposed in each main field area 501, as shown in FIG. 24B. The main field area 501 is generally as large as some hundreds of microns to several millimeters. In the case where the stage moves stepwise, it often moves for such each main field area 501. Further, the main field area 501 is exposed for each sub field area 502. After the pattern in the sub field area 502 has been exposed, the deflection voltage is applied to the main-deflector. Then, the electron beam is deflected, and a sub field area 502 in which next exposure is carried out is selected. The size of the sub field area 502 is generally within the range from some tens of microns to some hundreds of microns, and a stabilization time of the deflection voltage to be applied from the main-deflection amplifier is often set to 1 second to several micro second.

Then, the electron beam is deflected by the sub-deflector, whereby, as shown in FIG. 24C, the shaped electron beams are sequentially shot at predetermined positions in the sub field area 502, and an EB shot pattern 503 is exposed. In general, the maximum size of electron beam is within the range from one to several microns, and the stabilization time for the deflection voltage to be applied from the sub-deflection amplifier is set to some hundreds of nanoseconds.

In the case where a character opening is selected for each EB shot, it is required to move a long deflection distance for each EB shot. A area in which a character can be selected by beam deflection using a shaping deflector of the second shaping aperture mask is within the range of some hundreds of microns to several millimeters. Therefore, the stabilization time of the deflection voltage to be applied from the shaping deflection amplifier when deflection should be carried out at the same time is extended as compared with the stabilization time of the deflection voltage to be applied from the sub-deflection amplifier required for emitting the electron beam onto a wafer for each EB shot. As a result, the long stabilization time is integrated for each EB shot, a total of stabilization times is extended, and then, exposure throughput is degraded. Even when the number of EB shots is reduced in accordance with the CP scheme, if the stabilization time is very long, exposure in accordance with the VSB scheme can improve throughput more significantly.

As described above, even when the number of EB shots is reduced in accordance with the CP scheme, if the deflection distance on the CP aperture mask is long, and the stabilization time is very long, there has been a problem that exposure in the VSB scheme can improve throughput more significantly.

BRIEF SUMMARY OF THE INVENTION

According to an aspect of the present invention, there is provided a charged particle beam exposure method for exposing a predetermined pattern by irradiation of a charged particle beam for each deflection area in which a charged particle beam can be irradiated by deflection of the charged particle beam, the exposure method comprising:

placing an aperture mask having a plurality of character openings in an exposure apparatus that including a shaping deflector which deflects the charged particle beam on the aperture mask and an irradiation positioning deflector which deflects on a sample the charged particle beam shaped by the character opening;

applying a first deflection voltage to the shaping deflector, the first deflection voltage deflects the charged particle beam at an first character opening;

sequentially exposing all the character patterns which can be exposed by the charged particle beam shaped by the first character opening in the deflection area after a stabilization time set as a function of a shaping deflection voltage has elapsed after applying the first shaping deflection voltage;

applying a second deflection voltage to the shaping deflector after all the character patterns in the deflection area have been exposed by the charged particle beam shaped by the first character opening, the second deflection voltage deflects the charged particle beam at a next character opening of the first character opening; and sequentially exposing all the character patterns which can be exposed by the charged particle beam shaped by the next character opening in the deflection area after the stabilization time set as a function of the shaping deflection voltage has elapsed after applying the second shaping deflection voltage.

According to an aspect of the present invention, there is provided a charged particle beam exposure method for exposing a predetermined pattern by irradiation of a charged particle beam for each deflection area in which a charged particle beam can be irradiated by deflection of the charged particle beam, the exposure method comprising:

placing an aperture mask having a plurality of character openings in an exposure apparatus which comprises a shaping deflector which deflects the charged particle beam on the aperture mask and an irradiation positioning deflector which deflects on a sample the charged particle beam shaped by the character opening;

applying a first deflection voltage to the shaping deflector, the first voltage deflects the charged particle beam at an first character opening;

sequentially exposing all the character patterns which can be exposed by a charged particle beam shaped by the first character opening in the deflection area after applying the first shaping deflection voltage;

after all the character patterns in the deflection area has been exposed by the charged particle beam shaped by the first character opening, applying a second deflection voltage to the shaping deflector, and then, deflecting the charged particle beam at a next character opening of the first character opening;

sequentially exposing all the character patterns which can be exposed by a charged particle beam shaped by the next character opening in the deflection area after applying the second deflection voltage, wherein the charged particle beam is deflected at a predetermined deflection path in which the charged particle beam selects each character opening for use in exposure in the deflection area one time, and an exposure start position and an exposure end position of the character pattern are selected from among two exposure positions close to a predetermined position in the deflection area.

According to an aspect of the present invention, there is provided a charged particle beam exposure method for exposing a predetermined pattern by irradiation of a charged particle beam for each deflection area in which a charged particle beam can be irradiated by deflection of the charged particle beam, the exposure method comprising:

placing a sample in an exposure apparatus which including an irradiation positioning deflector which deflects the charged particle beam shaped in a basic unit graphics on the sample;

applying to a first deflection voltage the irradiation positioning deflector, the first deflection voltage deflects the charged particle beam at a predetermined exposure position in the deflection area;

exposing a unit pattern at a predetermined exposure position by using the charged particle beam in the unit graphics shape after a stabilization time set as a function of the deflection voltage has elapsed after applying the first deflection voltage;

applying a second deflection voltage to the irradiation positioning deflector after exposure at the predetermined position has terminated, the second deflection voltage deflects the charged particle beam at a next exposure position of the predetermined exposure position in the deflection area; and exposing a unit pattern at the next exposure position by using the charged particle beam in the basic unit graphics shape after a stabilization time set as a function of the deflection voltage has elapsed after applying the second deflection voltage, wherein, in the deflection area, a charged particle beam in the unit graphics shape is deflected at a deflection path with the shortest distance, of the deflection paths each passing one time an exposure position of a unit pattern to be exposed by the charged particle beam shaped in the basic unit graphics.

According to an aspect of the present invention, there is provided a charged particle beam exposure method for exposing at a plurality of positions by using a charged particle beam in a unit graphics shape for each deflection area in which a charged particle beam can be irradiated by deflection of the charged particle beam, thereby exposing a predetermined pattern on a sample, wherein an exposure start position and an exposure end position of the charged particle beam in the unit graphics shape are selected from among two exposure positions close to a predetermined position in the deflection area.

According to an aspect of the present invention, there is provided a charged particle beam exposure method for exposing a predetermined pattern by irradiation of a charged particle beam for each deflection area in which a charged particle beam can be irradiated by deflection of the charged particle beam, the exposure method comprising:

placing an aperture mask having a plurality of character openings in an exposure apparatus including a shaping deflector which deflects the charged particle beam on the aperture mask, and an irradiation positioning deflector which deflects on a sample the charged particle beam shaped by the character opening;

preparing exposure data used for exposure in a character projection method, the exposure data having described information corresponding to: a predetermined deflection path in which a charged particle beam selects one time a character opening for use in exposure in a deflection area of the sample; and an exposure position and/or sequence of the character patterns in the deflection area capable of being exposed in accordance with the selected character opening;

applying a deflection voltage to the shaping deflector based on the exposure data, followed by deflecting the charged particle beam at a character opening formed at the aperture mask; and after a stabilization time set as a function of the shaping deflection voltage has elapsed after applying the shaping deflection voltage, deflecting by the deflector the charged particle beam shaped through the character opening based on the exposure data, followed by sequentially exposing all the character patterns in the deflection area.

According to an aspect of the present invention, there is provided a method for generating charged particle beam exposure data comprising:

dividing pattern data for which exposing with a charged particle beam into a plurality of deflection areas, with respect to each deflection area, referring to location information of a character opening located at an aperture mask, followed by dividing the pattern data into a pattern in which exposing in accordance with a variable shaping beam scheme and a pattern in which exposing in accordance with a character projection scheme and selecting a character opening for use in exposure in accordance with the character projection scheme;

dividing the pattern in which exposing in accordance with the variable shaping beam into a plurality of unit patterns being a unit in which exposing, with respect to each deflection area;

obtaining a path with the shortest distance from the paths each passing through the each divided pattern one time, with respect to each deflection area;

determining an exposure sequence of a unit pattern based on the obtained path, followed by producing shot data on a pattern to be exposed in accordance with the variable shaping beam scheme, with respect to each deflection area;

obtaining a path with the shortest distance from the paths each passing through each character opening one time based on a location information on selected character openings, with respect to each deflection area, determining a selection sequence of the character openings based on the obtained path, with respect to each deflection area;

obtaining a path with the shortest distance from the paths each passing through each patterns one time, the each patterns to be exposed by the charged particle beam shaped the one character opening, with respect to each character openings of each of the deflection areas;

determining an exposure sequence of the character patterns based on the obtained path, with respect to each deflection area; and producing shot data on a pattern to be exposed in accordance with the character projection scheme from the selection sequence of the character openings and the exposure sequence of the character patterns; and producing a charged particle beam exposure data which being integrated with the shot data in accordance with the variable shaping beam scheme and the shot data in accordance with the character projection scheme so that a pattern in accordance with the character projection scheme is exposed next to a pattern in accordance with the variable shaping beam scheme, with respect to each deflection area.

According to an aspect of the present invention, there is provided a method for producing charged particle beam exposure data comprising:

dividing pattern data for which exposing with a charged particle beam into a plurality of deflection areas;

dividing the pattern data into patterns in which exposing in accordance with a character projection scheme based on a location information on character openings located in an aperture mask, and selecting a character opening for use in exposure in accordance with the character projection scheme, with respect to each deflection area;

determining the exposure sequence of character patterns each in which an exposure start position and an exposure end position are selected from among two exposure positions close to a predetermined position in a deflection area, with respect to each deflection area; and producing charged particle beam exposure data based on the exposure sequence of the determined character patterns.

DETAILED DESCRIPTION OF THE INVENTION

Hereinafter, embodiments of the present invention will be described with reference to the accompanying drawings.

FIRST EMBODIMENT

Figure 22:
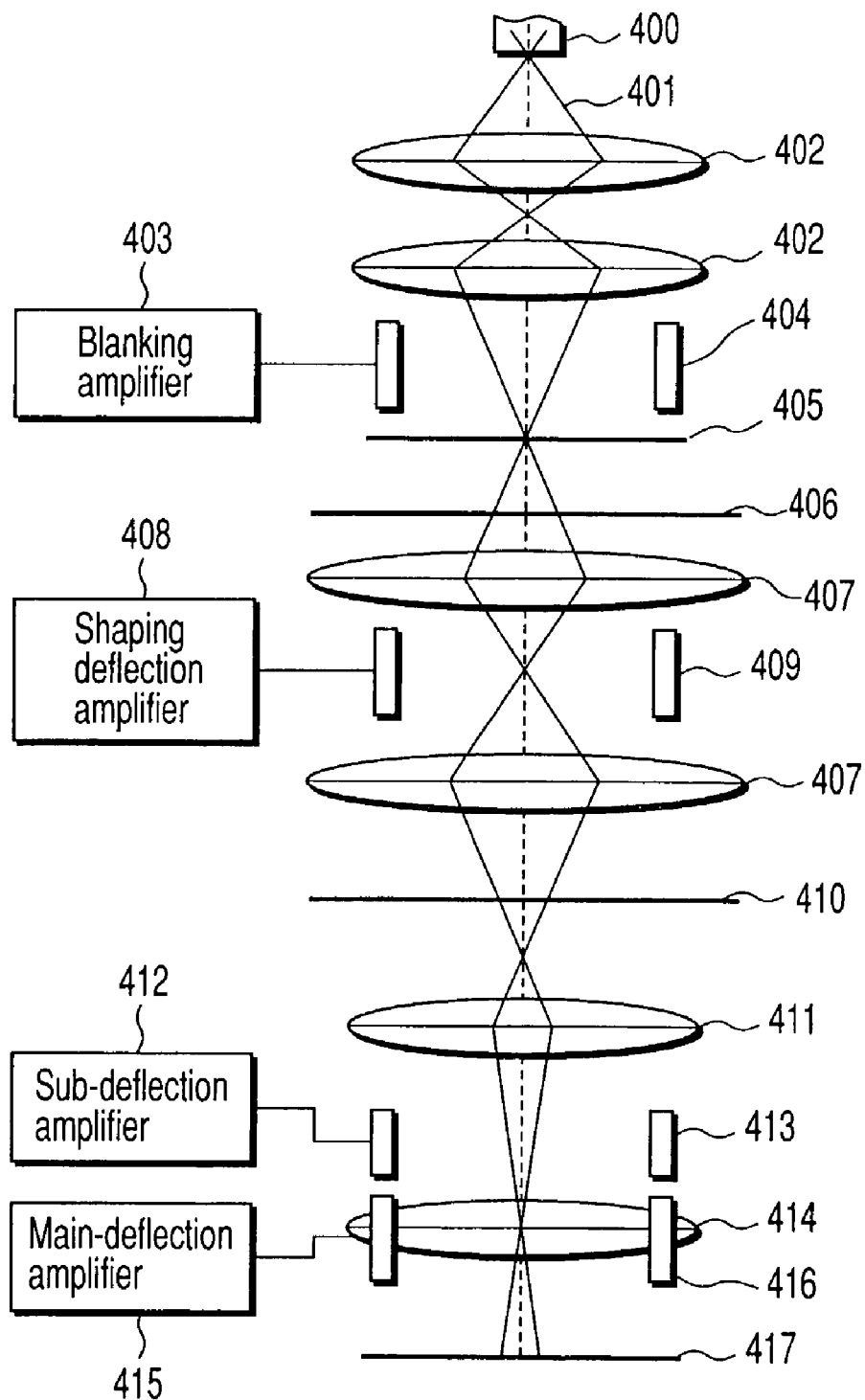
FIG. 22 is a view showing a general configuration of an electron beam exposure apparatus.
Figure 23:
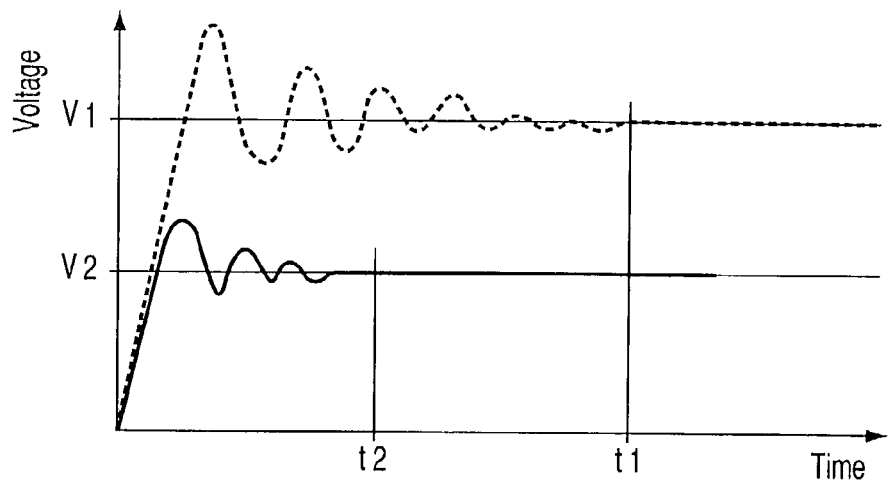
FIG. 23 is a characteristic view showing a deflection voltage and time dependency.
Figure 24A:
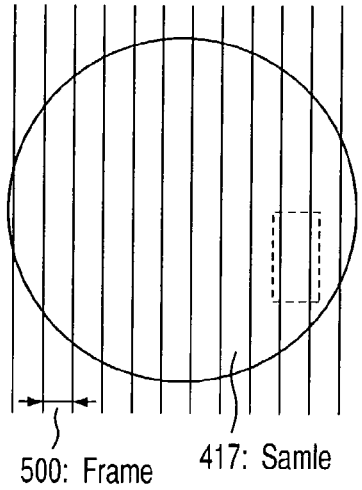
FIG. 24A to FIG. 24C are views for illustrating a concept of electron beam exposure using a main-deflector and a sub-deflector.
Figure 24B:
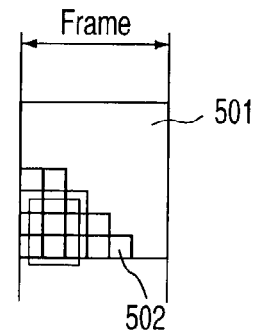
Figure 24C:
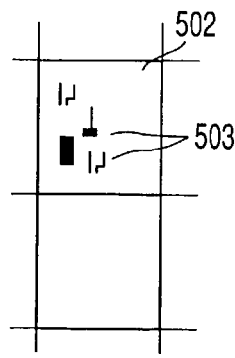

An electron beam exposure method according to a first embodiment of the present invention uses an exposure apparatus described with reference to FIG. 22 showing a prior art. In this method, when a pattern in each sub field area is exposed, a total of stabilization times of the deflection voltage to be applied from a shaping deflection amplifier to a shaping deflector is minimized. This exposure method can be applied to charged particle beams such as X-rays or ion beams without being limited to the following electron beams.

A circuit pattern of a logic device such as ASIC is designed by combining SCs called standard cells with each other while a logical functional block is defined in a minimum unit. Recently, as a device pattern becomes miniaturization, the size of such each SC is miniaturized. For example, the size of the SC is sized to be housed in an electron beam of 5 µm in maximum. Even in an SC which is greater than the beam size, if a reduction effect of the number of shots is large as compared with VSB exposure, it is desirable that exposure be carried out in accordance with the CP exposure based on a plurality of EB shots by dividing into a plurality of characters.

From this fact, when the circuit pattern of a logic device such as ASIC is produced in accordance of EB lithography of the CP exposure, it is desirable that the SC used in the circuit pattern be defined as a character in view of the reduction effect of the number of shots.

Figure 1:
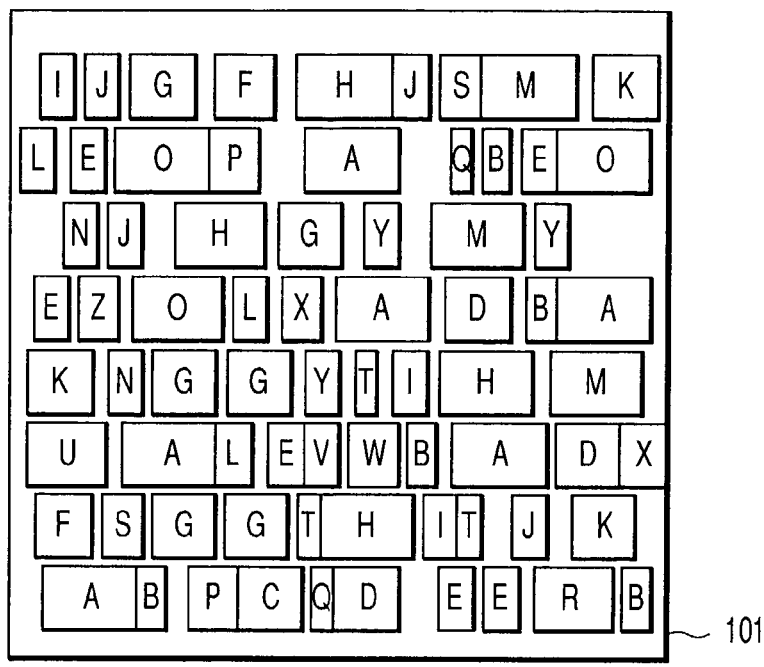
FIG. 1 is a view showing an example of patterns formed in one sub field area according to a first embodiment of the present invention.

FIG. 1 shows an example of patterns formed in a single sub field area when the circuit pattern of a logic device is produced in accordance with EB lithography. All of the patterns in the sub field area 101 consist of a combination of SCs. As shown in FIG. 1, 26 types of SCs from A to Z are located in the sub field area 101.

Figure 2:
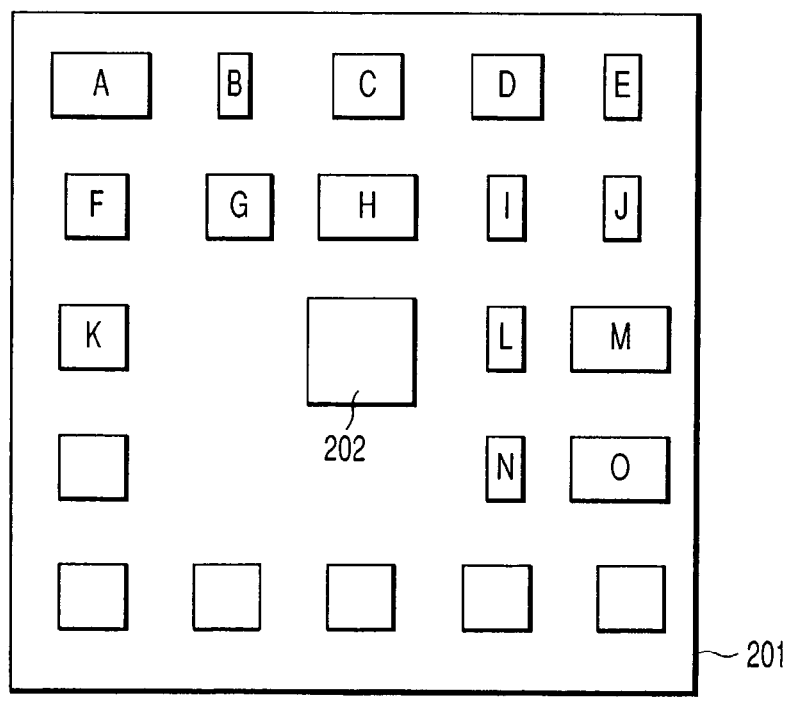
FIG. 2 is a view showing a configuration of a CP aperture mask according to the first embodiment.

In contrast, the CP aperture mask 201 as shown in FIG. 2 has already been produced. Assume that this CP aperture mask 201 is used as a second shaping aperture mask.

Character openings corresponding to 15 types of SCs from A to O of all the SCs from A to Z located in the sub field area 101 are formed in the CP aperture mask 201. Therefore, these 15 types of SCs can be exposed as characters in accordance with the CP exposure. In addition, the other 11 types of SCs from P to Z do not have any character opening in the CP aperture mask 201. Thus, an electron beam is shaped by using the opening formed in a first shaping aperture and a VSB opening 202, whereby exposure is carried out in accordance with the VSB exposure.

In the EB exposure in accordance with the VSB exposure, a stabilization time of the deflection voltage to be applied from the sub-deflection amplifier required for an interval of EB shots is greater than that of the deflection voltage to be applied from the shaping deflection amplifier. Therefore, in general, the sequence for exposing is determined depending on a position where each pattern in the sub field area is exposed. However, in this method, CP exposure requiring selection of character opening for each shot causes an increase in exposure time due to a stabilization time of the deflection voltage to be applied from the character selection deflection amplifier.

Because of this, the exposure sequence of patterns in each sub field area is considered with respect to a pattern in which exposure can be carried out in accordance with the CP scheme and a pattern in which exposure can be carried out in accordance with the VSB scheme, respectively.

1. CP Exposure

Character openings are sequentially selected while an electron beam is deflected in a deflection path with the shortest distance, of all the deflection paths passing through the character openings A to O to be used on the CP aperture mask 201.

2. VSB Exposure

Each SC pattern is divided into a plurality of rectangle patterns, and each pattern is exposed in accordance with the sequence determined depending on these exposure positions.

The sequences for carrying out exposure of the CP exposure and VSB exposure are not restricted in particularly, and either sequence may be available from among CP→VSB and VSB→CP.

Figure 3:
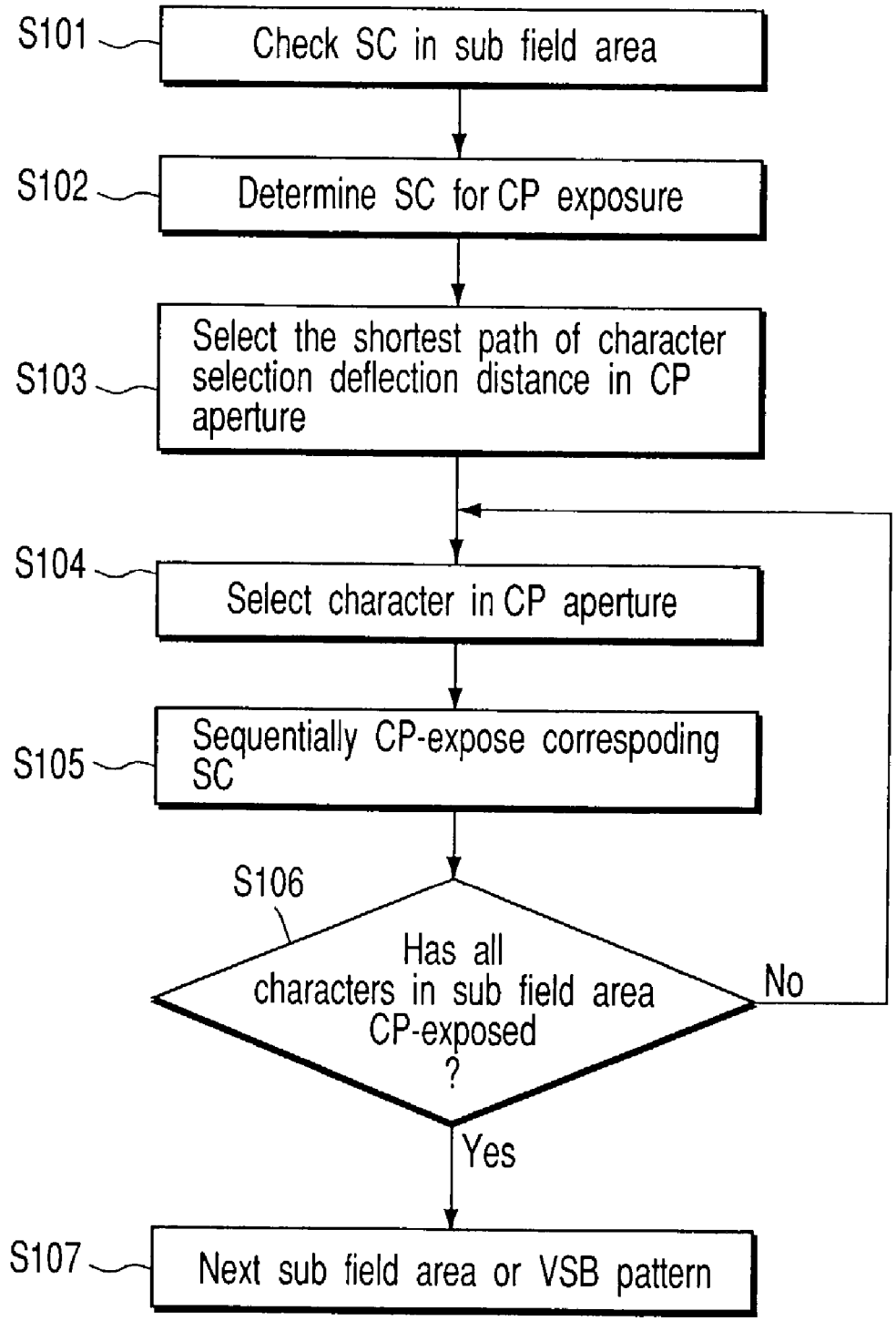
FIG. 3 is a flow chart showing an electron beam exposure method according to the first embodiment.

The exposure sequence for CP exposure pattern will be described in detail. FIG. 3 is a flow chart showing a method for exposing a CP exposure when exposure is carried out in each sub field area. In this flow chart, there is shown a sequence for exposing a pattern to be exposed in accordance with the VSB after exposure has been carried out in accordance with the CP.

(Step S101)

First, an SC located in a sub field area to be exposed is checked.

(Step S102)

A character (SC) mounted on a CP aperture mask for use in exposure is compared with that extracted in the step S101, and the SC to be exposed in accordance with the CP scheme is determined.

(Step S103)

A deflection path with the shortest distance, of all the deflection paths for selecting each of the character openings A to O to be used, is selected from among the locations of characters to be exposed on the CP aperture mask. For example, in the previously shown example (FIG. 1 and FIG. 2), exposure is carried out in accordance with the sequence indicated by the arrow in FIG. 4.

As an algorithm for determining these sequences, there can be used a technique conventionally discussed with respect to a Traveling Salesman Problem (TSP). The TSP has a plurality of algorithms as a method for searching a path with the shortest distance when a plurality of points are connected to each other. These algorithms can be applied by application of the existing algorithms.

(Step S104)

An electron beam is deflected in the single character opening on a CP aperture in accordance with the sequence of paths determined in the step S103, and the electron beam is irradiated to the character opening. At this time, a stabilization time of the deflection voltage to be applied from the character selection deflection amplifier is set as a function of the deflection voltage.

(Step S105)

The character pattern in the sub field area corresponding to the character opening to which the electron beam is irradiated in the step S104 are successively exposed at a desired position.

(Step S106)

When the electron beams have been deflected all exposing position relevant to the character pattern in accordance with the deflection sequence of the step S103, processing goes to the step S107. In the case where a exposing position to which an electron beam is to be deflected still remains, processing reverts to the step S104 in which the electron beam is deflected to the next character opening.

(Step S107)

After the SCs corresponding to all the character patterns in the sub field area have been exposed in accordance with the CP scheme, exposure moves to the next sub field area. In addition, if patterns to be exposed in the VSB scheme exist, the VSB exposure patterns in the sub field area are sequentially exposed.

The sub field areas are sequentially exposed as described above, whereby the deflection voltage required for beam deflection of the character selection deflector can be reduced while character openings each are selected. The stabilization time of the deflection voltage to be applied from the character selection deflection amplifier is set as a function of the deflection voltage, whereby a total of the stabilization times of the deflection voltage to be applied from the deflection amplifier according to selection of these characters each can be reduced more significantly.

In a logic device such as ASIC, in an exposure method such that a character opening is selected, the stabilization time of the deflection voltage to be applied from the character selection deflection amplifier is extended, and the exposure time is extended concurrently as well. In contrast, in the method shown in the present embodiment, there is no need to select a character opening for each shot. Alternatively, the stabilization time of the deflection voltage to be applied from the deflection amplifier required for selection of a character opening can be set to be short, and thus, the exposure time can be reduced. Therefore, even in the case of using a CP aperture mask used for producing the circuit pattern of another product, the desirably maximum exposure throughput can be achieved.

SECOND EMBODIMENT

Hereinafter, a description will be given with respect to the present embodiment for the purpose of throughput improvement in consideration of a stabilization time for each shot on a wafer and a VSB shot as well as selection of a character opening.

Figure 5:
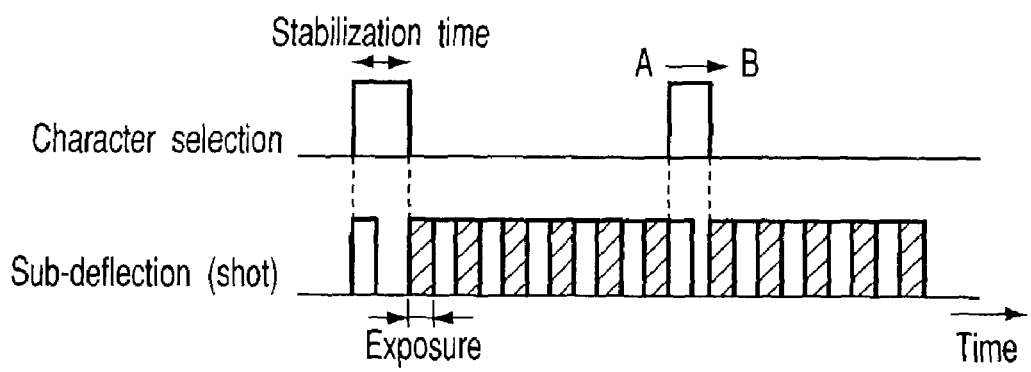
FIG. 5 shows a relationship among a stabilization time of a character selection deflector, a stabilization time of a sub-deflector, and an exposure time.

According to the first embodiment, as shown in FIG. 5, a character opening is selected, a character beam for exposing is shaped, and then, only a character pattern of that shape is exposed. Namely, in the case where exposure of the same character is repeated, a character opening is not selected for each shot. Thus, reduction of a time according to definition of a shot position by a sub-deflector at an predetermined position in a main field area on a wafer and actual beam exposure is more effective in reduction of a total stabilization time and throughput improvement than a deflection stabilization time of a character selection deflector.

FIG. 5 shows a relationship between a stabilization time and an exposure (shot) time when a time is taken on a horizontal axis, the shot of a certain character beam is repeated, and a character opening to be exposed next is selected. In a conventional method, the stabilization time of the deflection voltage to be applied from a sub-deflection amplifier for each shot in the sub field area has been predetermined.

Figure 4:
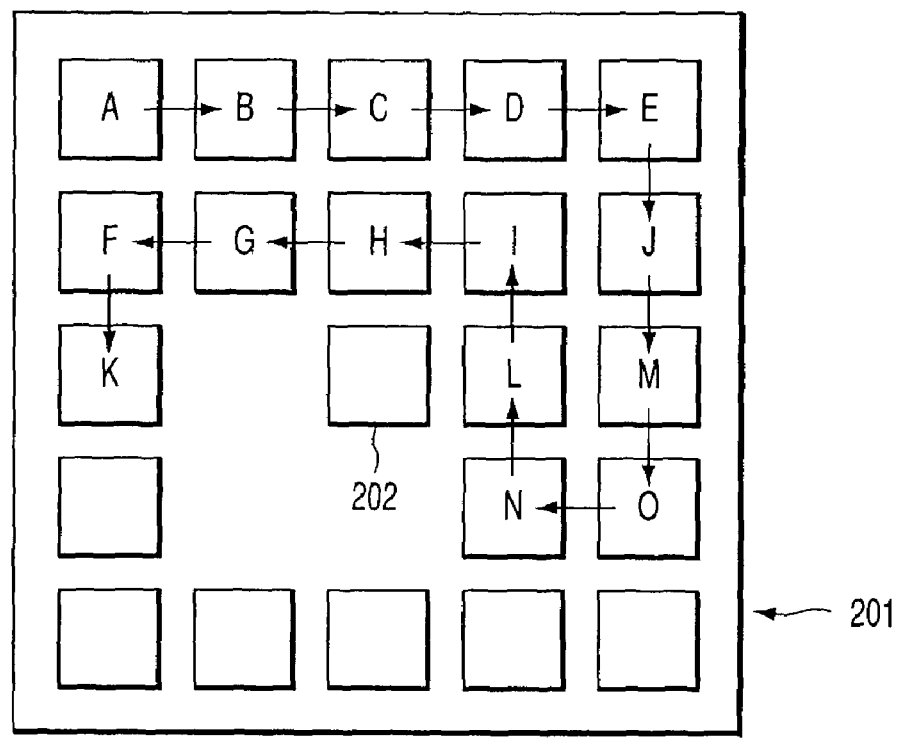
FIG. 4 is a view showing a selection sequence of character openings mounted on the CP aperture mask according to the first embodiment.
Figure 6:
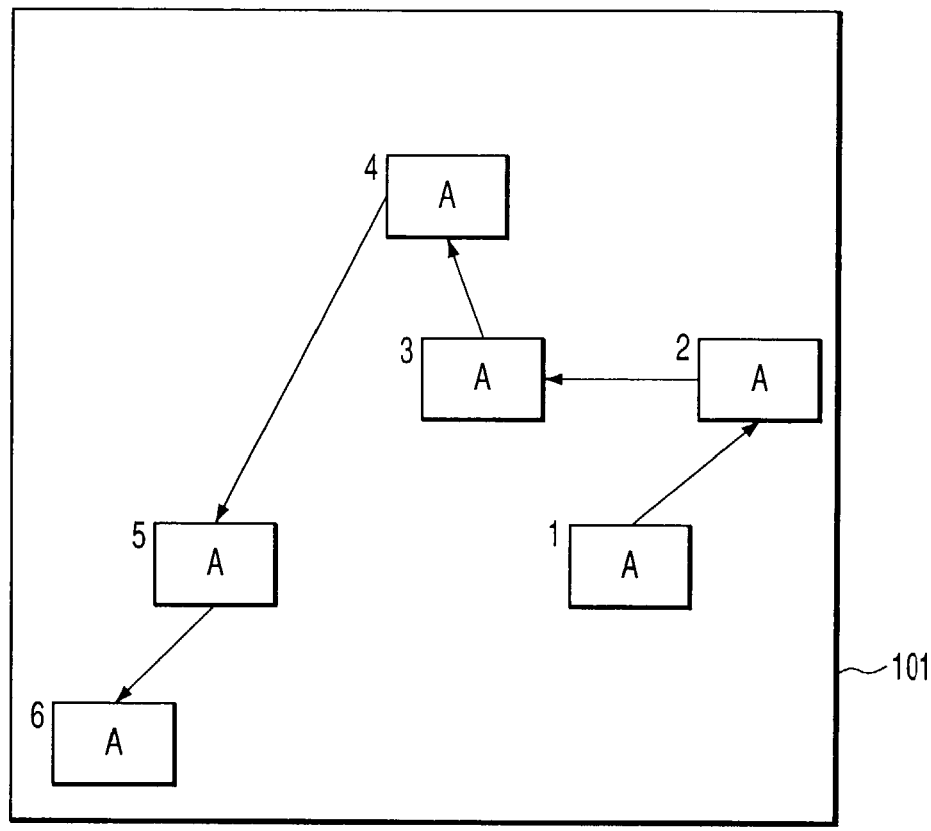
FIG. 6 is a view showing a shot sequence of character patterns in a sub field area according to a second embodiment of the present invention.
Figure 7:
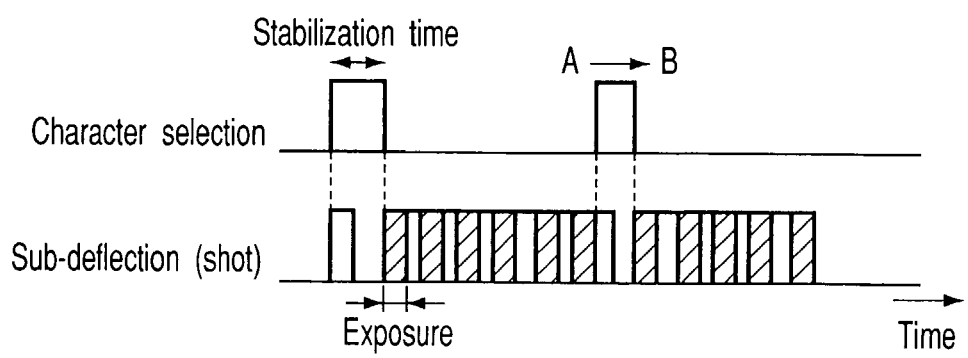
FIG. 7 shows a relationship among a stabilization time of a character selection deflector, a stabilization time of a sub-deflector, and an exposure time according to the second embodiment.

In the case where the pattern in the sub field area shown in FIG. 1 is exposed by using the CP aperture mask shown in FIG. 4, for example, character opening A is selected, and a standard cell consisting of character A in the sub field area is exposed six times. Then, character opening B is selected, and shots are repeated at a desired position in the deflection area five times. At this time, as shown in FIG. 6, assume that the shot sequence of character A has been determined in the sub field area 101. As is evident from FIG. 6 as well, there is dispersion in beam deflection distance of the sub-deflector between shots. Therefore, the stabilization time of the deflection voltage to be applied from the sub-deflection amplifier for each shot in the sub field area is defined as a function of the deflection distance or deflection voltage of the sub-deflector between shots in FIG. 6, and is changed according to the quantity of the distance, whereby a total shot waiting time can be reduced, as shown in FIG. 7.

Although the above description has been given with respect to character exposure in accordance with the CP scheme, this applies to a pattern to be exposed in accordance with the VSB scheme. In this case, the stabilization time of the deflection voltage to be applied from the sub-deflection amplifier is changed according to the deflection distance between VSB shots, whereby a total shot stabilization time for a pattern to be exposed in accordance with the VSB scheme can be minimized.

In addition, in order to minimize the total stabilization time in accordance with the CP scheme and VSB scheme, it is required to determine the exposure sequence when a total of beam deflection distances caused by the sub-deflector is minimized when the corresponding pattern in each sub field area is exposed. This determination is carried out in the same way as determination of the character selection sequence in the first embodiment.

As an algorithm for determining these sequences, there can be used a technique for Traveling Salesman Problem (TSP) which has been conventionally discussed. The TSP has a plurality of algorithms as a method for searching a path such that a distance connecting a plurality of points to each other is minimal. These algorithms can be applied by application of the existing algorithms.

As illustrated in the present embodiment, with respect to exposure of a pattern in the sub field area as well, in the same way as when a character is selected and deflected, the stabilization time of the deflection voltage to be applied from the sub-deflection amplifier is defined as a function of the deflection distance of a beam caused by the sub-deflector, whereby a total of shot waiting time relevant to exposure of the whole sub field area can be reduced.

In addition, with respect to the patterns in the sub field area, the exposure sequence of the respective patterns to be exposed in accordance with the CP scheme and VSB scheme is determined so that a total of deflection distances of the beam caused by the sub-deflector is the shortest, whereby the total of shot waiting times can be the shortest.

As described previously, exposure can be carried out such that a total of shot waiting times for each shot are reduced when exposure of the patterns in the sub field area is repeated. Therefore, a time required for exposure can be reduced, and throughput improvement can be achieved.

THIRD EMBODIMENT

In the first and second embodiments, there has been described that: the patterns in a single sub field area are divided into the patterns to be exposed in accordance with the CP scheme and the patterns to be exposed in accordance with the VSB scheme; these patterns in the respective schemes each are exposed in all; and exposure in one scheme terminates, and then, exposure in the remaining scheme is carried out. In the first embodiment, there has been described that the exposure sequence is not restricted in particular, and any of the exposure sequences of CP→VSB and VSB→CP may be used.

In the present embodiment, there has been described an exposure sequence which is more advantageous than that of the first embodiment in view of reduction of the waiting time.

In general, in exposure in accordance with the CP scheme, an electron beam is irradiated to the whole opening of the character shape on the CP aperture in order to shape the electron beam to be irradiated to a wafer. The CP aperture mask has a predetermined gap between the respective character openings, as shown in FIG. 2. Therefore, in character selection in accordance with the CP scheme, an electron beam may be deflected so that the whole character opening to be selected can be irradiated uniformly.

In contrast, in electron beam shaping in accordance with the VSB scheme, an electron beam must be partially irradiated according to the electron beam size shaped at a rectangular opening for the VSB in the CP aperture mask, i.e., the second shaping aperture mask. That is, it is required to adjust a deflection quantity of electron beam according to the shape and size of the electron beam to be irradiated to a wafer.

From these facts, electron beam deflection is adjusted in particular between exposure in accordance with the CP scheme and exposure in accordance with the VSB scheme before carrying out exposure in accordance with the VSB scheme. Namely, apart from the stabilization time of the deflection voltage to be applied from the deflection amplifier of the character selection deflector, the waiting time caused by adjustment of the shaping deflection amplifier is required for changing of CP→VSB similarly. This waiting time is longer than that for character selection or deflection. To suppress an increase in waiting time is effective in reduction of the processing time.

Figure 8:
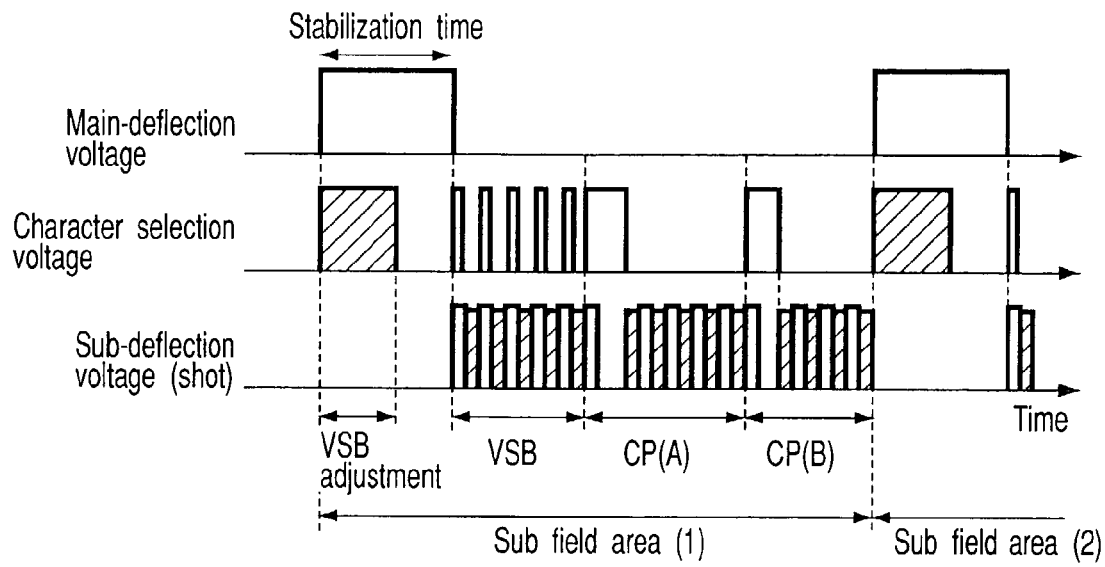
FIG. 8 shows a relationship in stabilization time among a main-deflector, a character selection deflector, and a sub-deflector according to a third embodiment of the present invention.

As shown in FIG. 8, a sequence of VSB→CP is employed as a sequence of exposure of patterns in each sub field area. In this manner, the VSB shaping deflection amplifier can be adjusted at the same time when each sub field area is selected by the main-deflector.

The shaping deflection amplifier can be adjusted for VSB during a stabilization time of the deflection voltage to be applied from the main-deflection amplifier, and an increase in total waiting time caused by this waiting time can be prevented.

As described in the present embodiment, when the pattern in each sub field area is exposed, the pattern to be exposed in the VSB scheme is preferentially exposed, and then, the pattern to be exposed in the CP scheme is exposed. Because of this, an adjustment time for carrying out VSB exposure of the shaping deflection amplifier can be included in a selection time of the sub field area by the main-deflector. That is, the shaping deflection amplifier can be adjusted during a main-deflection waiting time. Thus, an increase in whole processing time caused by a waiting time of exposure due to this adjustment time can be suppressed, and throughput degradation can be suppressed.

FOURTH EMBODIMENT

The present embodiment describes a method for producing electron beam exposure data for the purpose of achieving the electron beam exposure method described in the first to third embodiments.

With respect to the present electron beam exposure method, the following processes are different from a conventional method for producing electron beam exposure data.

Figure 9:
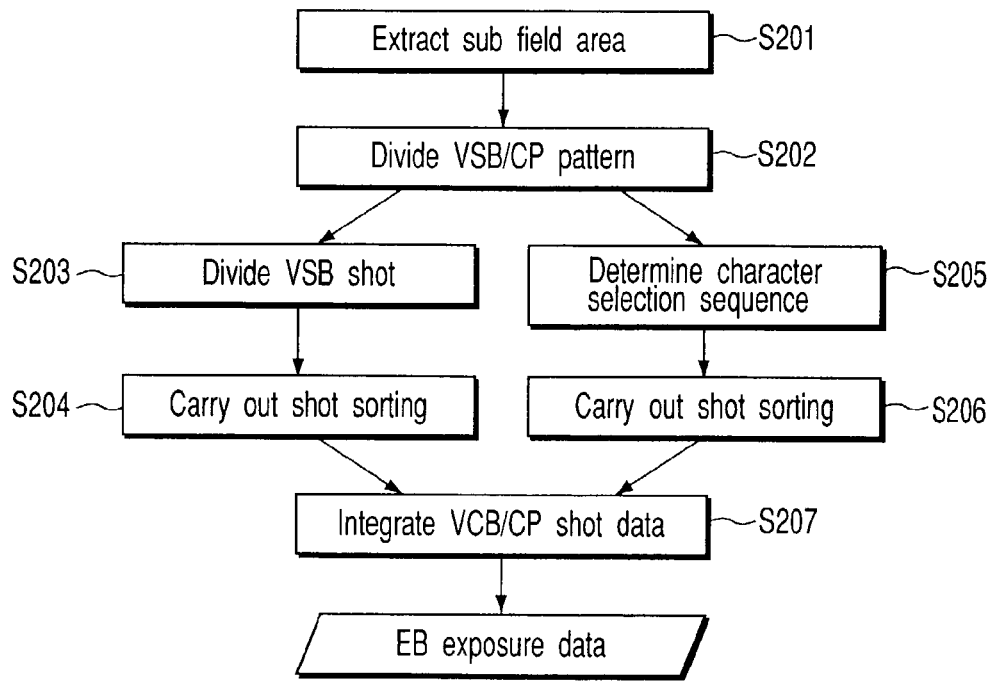
FIG. 9 is a flow chart showing a method for producing electron beam exposure data according to a fourth embodiment of the present invention.

Determining a character selection sequence
VSB→CP pattern exposure sequence
Determining a VSB shot exposure sequence
Determining a CP shot exposure sequence The flow of producing electron beam exposure data considering these processes is shown in FIG. 9.

(Step S201)

Patterns formed in each sub field area are extracted from pattern data.

(Step S202)

The extracted patterns are classified into patterns to be exposed in accordance with the VSB scheme and patterns to be exposed in the CP scheme. At this time, if an available CP aperture mask has been determined, by referring to the aperture mask data, a pattern in which there exists a character opening formed on the aperture mask can be exposed in accordance with the CP scheme, and another pattern can be exposed in accordance with the VSB scheme.

(Step S203)

Patterns classified into exposure in accordance with the VSB scheme in the step S202 are divided into VSB shot patterns (basic unit graphics). Specifically, polygonal patterns to be exposed in accordance with the VSB scheme are divided into rectangular patterns of their size equal to or smaller than the maximum beam size.

(Step S204)

The exposure sequence of VSB shot patterns divided and produced in the step S203 is determined depending on the beam irradiation position in the sub field area, and shot data is arranged in order. At this time, a deflection path with the shortest distance, of the deflection paths passing through respective patterns divided into the VSB shot patterns one time, is obtained, and the exposure sequence is determined from the objected path. The deflection path with the shortest distance is obtained by using the shortest path search algorithm for solving TSP.

(Step S205)

The selection sequence of the character openings included in the sub field area to be exposed is determined with respect to the patterns classified as exposure in accordance with the CP scheme in the step S202.

In this step, the location of the character opening on the CP aperture mask to be used is acquired from aperture mask data. A deflection path with the shortest distance, of the deflection paths passing through the respective character openings one time, is obtained, and the selection sequence of the character openings is determined from the obtained path. In this step as well, as in the step S204. the shortest-path search algorithm or the like for solving TSP can be used.

(Step S206)

In accordance with the exposure sequence of character openings determined in the step S205, the exposure sequence of patterns to be exposed at the character openings each is determined depending on the location of characters in the sub field area. A deflection path with the shortest distance, of the deflection paths passing through respective characters one time, is obtained, and the exposure sequence of characters is determined from the obtained path. In this step as well, as in the steps 204 and 205, the shortest-path search algorithm or the like for solving TSP can be used.

(Step S207)

The shot data produced in the steps S204 and S206 are arranged in order of VSP shot data→CP shot data, and the arranged data are produced relevant to all the sub field area s in order of the sub field areas to be exposed, thereby producing electron beam exposure data.

The electron beam exposure data is produced according to the present embodiment, thereby making it possible to produce exposure data suitable to the exposure method described in the first to third embodiments.

Therefore, the electron beam exposure data produced in accordance with the exposure data producing method according to the present embodiment is used. Therefore, the stabilization time of the deflection voltage to be applied from the deflection amplifier of the character selection deflector and the shot waiting times of patterns in the sub field area or a total of the respective waiting times can be the shortest, and throughput improvement can be achieved.

In addition, optimal exposure data is produced for each CP aperture mask to be used, thus making it possible to produce electron beam exposure data capable of achieving the highest throughput by means of its own CP aperture mask.

FIFTH EMBODIMENT

The present embodiment shows a result discussed by using an actual device pattern with respect to a case in which the stabilization time of the deflection voltage to be applied from the sub-deflection amplifier for each shot, of the deflection amplifiers described previously, is changed as shown in FIG. 10 according to a deflection distance between shots, i.e., a distance between patterns.

Figure 10:
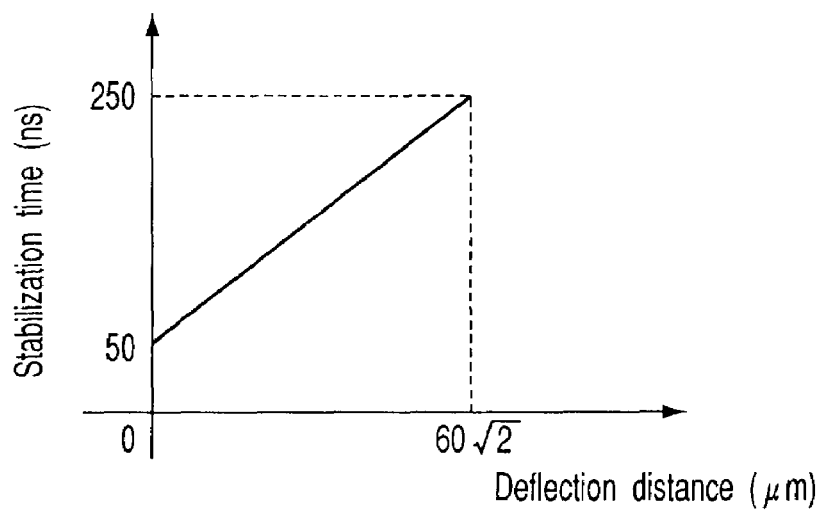
FIG. 10 is a view showing a relationship between a deflection distance and a stabilization time according to a fifth embodiment of the present invention.

The size of the sub field area of the exposure apparatus presumed here is 50 µm$^2$. However, as shown in FIG. 10, the maximum deflection quantity is defined as a diagonal line length of 60 µm including a superimposition portion relevant to the adjacent sub field areas. The used device patterns are divided into 9,983 pieces in the sub field area. In addition, the discussed pattern is one of the via hole layers. When exposure is carried out in accordance with the VSB scheme, a total of 2.03×10$^6$=2.03 M shots are required.

Figure 11:
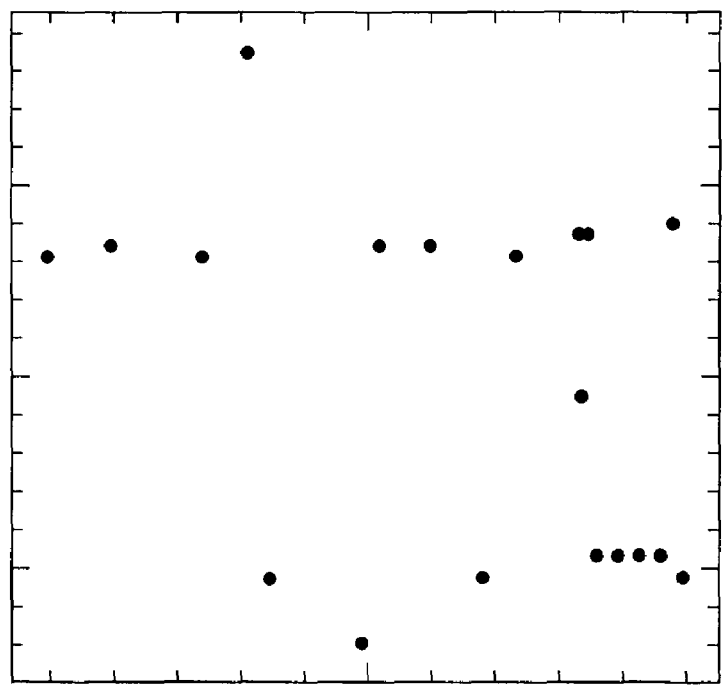
FIG. 11 is a view showing a shot position of an electron beam in accordance with a variable shaping beam scheme in a sub field area.
Figures 12, 13:
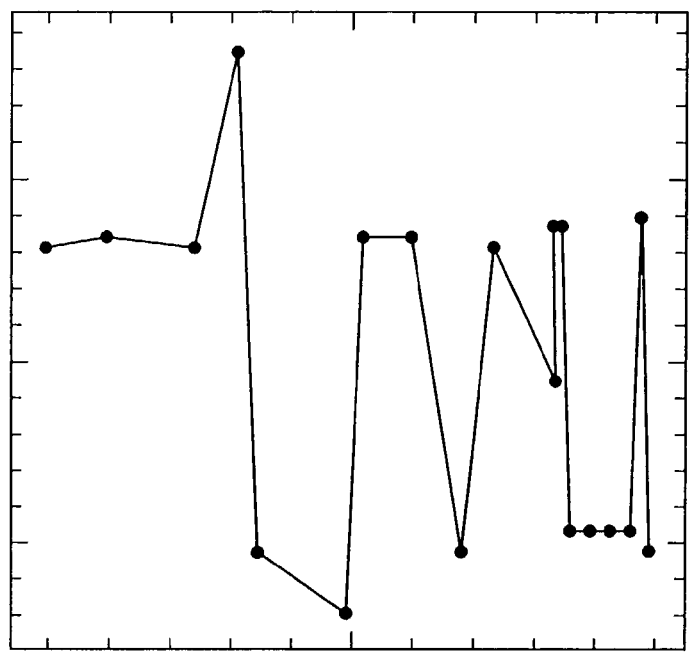
FIG. 12 is a view showing a deflection path of an electron beam obtained in accordance with a conventional method in response to the shot position shown in FIG. 11.
FIG. 13 is a view showing a deflection path of an electron beam obtained in accordance with a method according to the fifth embodiment in response to the shot position shown in FIG. 11.

Here, let us consider the sub field area in which this device pattern exists. As shown in FIG. 11, a pattern corresponding to 20 VSB shots is included. When the sequence of patterns to be shot is obtained by conversion into general shot data, sorting is seemingly carried out in accordance with a pattern coordinate. As a result, the shot sequence in the path shown in FIG. 12 is obtained. A total length of paths is 194.1 µm.

If the stabilization time of the deflection voltage to be applied from the sub-deflection amplifier corresponds to a deflection distance, a total of stabilization times should be reduced when this path is shorter in length. When the exposure sequence of shot positions each shown in FIG. 11 is arranged so that a total of deflection distances of the sub-deflector is the shortest, the path shown in FIG. 13 is obtained. At this time, a total of deflection distances are 142.0 µm.

Table 1 shows a result obtained by investigating a distribution of deflection distances in units of 0.1 µm in order to compare the deflection path obtained in the embodied method with that in a conventional method.

TABLE 1

| Distance | Present method | Conventional method |
|---|---|---|
| 0.1 | 1 | 1 |
| 0.6 | 0 | 1 |
| 1.7 | 2 | 3 |
| 2.1 | 1 | 0 |
| 3.6 | 1 | 0 |
| 4.0 | 1 | 1 |
| 5.1 | 1 | 1 |
| 5.2 | 1 | 0 |
| 6.8 | 2 | 0 |
| 7.3 | 1 | 1 |
| 8.1 | 1 | 1 |
| 8.5 | 0 | 1 |
| 8.9 | 0 | 1 |
| 9.1 | 1 | 0 |
| 10.1 | 1 | 0 |
| 10.5 | 1 | 0 |
| 11.2 | 1 | 1 |
| 11.6 | 1 | 0 |
| 14.7 | 1 | 0 |
| 16.9 | 0 | 1 |
| 17.1 | 0 | 1 |
| 17.5 | 0 | 1 |
| 17.8 | 0 | 1 |
| 18.5 | 0 | 1 |
| 20.8 | 0 | 1 |
| 24.2 | 1 | 0 |
| 27.5 | 0 | 1 |

As shown in Table 1, a series of shots with its long deflection distance decreases, and concurrently, the deflection waiting time of the deflection voltage to be applied from the sub-deflection amplifier can be reduced as well. In actuality, in the case where exposure is carried out in the deflection path shown in FIG. 12, when the stabilization time of the deflection voltage to be applied from the sub-deflection amplifier is constantly set to 250 ns irrespective of the deflection distance, a total of 4.75 μs is obtained. In addition, when the stabilization time according to the deflection distance shown in FIG. 10 is employed, 1.41 μs is obtained. However, the deflection path obtained according to the present method can be reduced to 1.29 μs. This computation has been carried out with respect to all the sub field areas. The algorithm for computing the shot sequence used here is referred to as a Travelling Salesman Problem (TSB), and a variety of algorithms are proposed. These algorithms include a problem that the shortest path is obtained when one visits predetermined cities only one time. At this time, a program using a technique called a local search technique is used (Ibaraki Toshihide, "Basic Tools for Algorithms (Final Session)", Science Co., Ltd. Computer Today No. 94, 1999, Issue of November, page 48).

Figure 14:
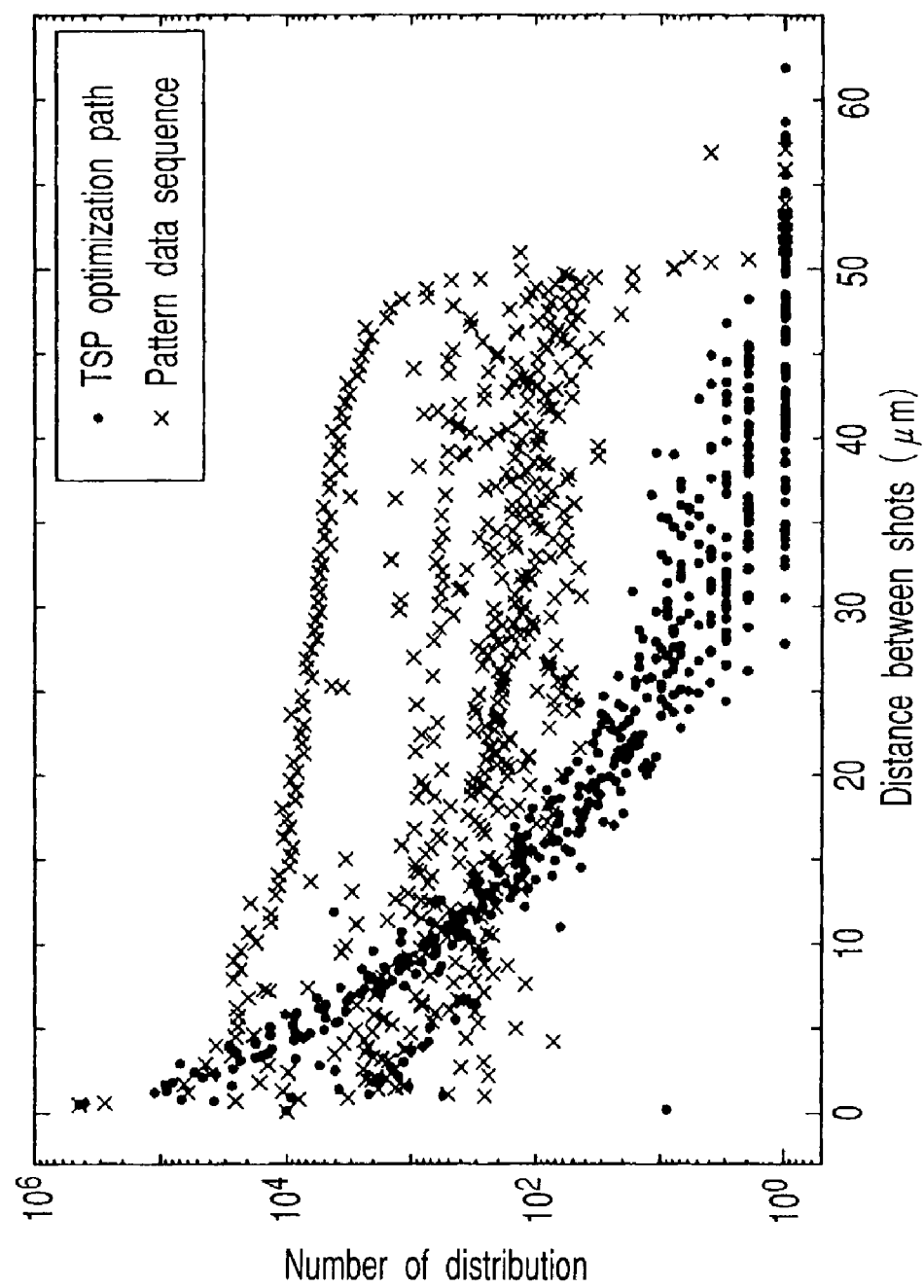
FIG. 14 is a characteristic view showing a distribution of deflection distance between electron shots in the whole sub field area.

FIG. 14 shows a distribution of distances between shots in the whole sub field area. The total deflection distance of the sub-deflector has been 17.0 mm when general pattern data is converted into shot data. In contrast, in the case where optimization has been carried out in accordance with the TSP, the distance can be reduced to 3.8 mm, the length of which is about 1/4.5 of the above distance. As is evident from FIG. 14, it is found that a combination of the sequence of shots with their long distances between shots is restricted.

When a total of the stabilization times of the deflection voltage to be applied from the sub-deflection amplifier are compared with another, the following result is obtained. In the conventional method for determining the shot sequence, sorting in accordance with the pattern coordinate value is often carried out in sequence when pattern data is converted into shot data as is. In a conventional technique of setting a waiting time, the waiting time is constantly set to 250 ns irrespective of the deflection distance of the sub-deflector between shots. In contrast, in the present method, the stabilization time of the deflection voltage to be applied from the sub-deflection amplifier according to the shot sequence or deflection distance when the shortest deflection distance is obtained by the TSP is changed as shown in FIG. 10. Table 2 shows a time when this device is formed as 100 chips on a wafer.

TABLE 2

| Shot sequence | Waiting time setting | One chip | 100 chips | Ratio |
|---|---|---|---|---|
| Conventional method | Conventional method | 504 ms | 50.5 s | 1.00 |
| Conventional method | Present method | 132 ms | 13.2 s | 0.26 |
| Present method | Present method | 100 ms | 10.0 s | 0.21 |

The waiting time between shots is thus changed as a function of the deflection distance of the sub-deflector, whereby a total waiting time can be reduced. In addition, the shot sequence is determined so that the deflection path of the sub-deflector is the shortest, whereby the waiting time can be reduced more significantly.

The shot in the sub field area of the electron beam exposure apparatus is positioned due to deflection of electrostatic or electromagnetic electron beam by the sub-deflector. The stabilization time of the deflection voltage to be applied from the sub-deflection amplifier is changed according to the value of voltage to be applied to the sub-deflector between shots, whereby the shot waiting time for each sub field area can be reduced. Further, the pattern shot sequence is determined so that a total of deflection distances of the sub-deflector is the shortest for each sub field area, whereby the shot waiting time can be the shortest. In this manner, a time required for exposure of a circuit pattern of a semiconductor device can be reduced, and the exposure throughput can be improved. In the present embodiment, there has been described a waiting time between shots in the sub field area when the circuit pattern is exposed onto a sample. However, with respect to exposure in accordance with the CP scheme as well as exposure in accordance with the VSB scheme, the completely same effect is achieved in that the exposure sequence is determined depending on the position to be shot.

Further, the technique of the present embodiment can be applied to selection of a character shaped drilled hole on the second shaping aperture mask in accordance with the CP scheme (on the CP aperture mask). In this case, the character selection sequence may be determined so that the deflection distance of the shaping deflector for carrying out character selection is the shortest. In exposure in accordance with the CP scheme, it is desirable that both of the character selection sequence and the sequence of shots onto the sample be optimized.

SIXTH EMBODIMENT

In general, exposure of the character pattern in the sub field area is carried out in order of exposure data. The exposure sequence is determined depending on the pattern position in the sub field area. Alternatively, in the VSB scheme, the sequence of carrying out exposure is determined depending on the shape or size of a unit pattern.

Figure 15A:
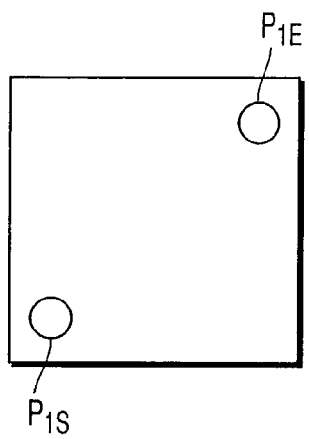
FIG. 15A is a plan view showing an exposure start position and an exposure end position of one character pattern #1 to be exposed in a single sub field area.
Figure 15B:
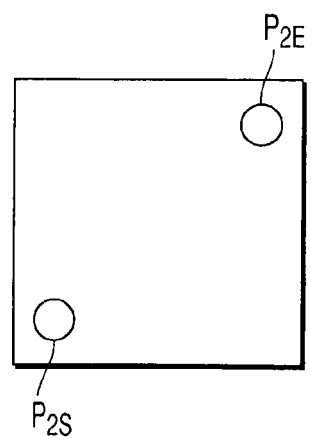
FIG. 15B is a plan view showing an exposure start position and an exposure end position of a character pattern #2.
Figure 16:
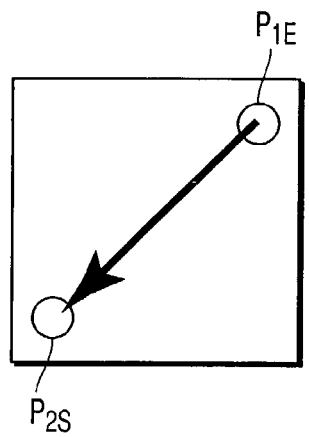
FIG. 16 is a plan view showing an exposure end position $P_{1E}$ of the character pattern #1 and an exposure start position $P_{2S}$ of the character pattern #2 in a superimposed manner.

For example, FIG. 15A and FIG. 15B each show an exposure start position and an exposure end position of character pattern #1 and character pattern #2 to be exposed in a single sub field area. FIG. 15A shows an exposure start position $P_{1S}$ and an exposure end position $P_{1E}$ of character pattern #1 in the CP scheme. FIG. 15B shows an exposure start position $P_{2S}$ and an exposure end position $P_{2E}$ of character pattern #2. As shown in FIG. 15A and FIG. 15B, the exposure end position $P_{1E}$ of character pattern #1 in a single sub field area is often significantly distant from the exposure start position $P_{2S}$ of the next character pattern #2. Further, this applies similarly to a character pattern to be exposed next as well. Because of this, as shown in FIG. 16, it is well evident when the above described two deflection areas are displayed to be superimposed on each other. However, when an electron beam is positioned by means of the sub-deflection from the shot end position $P_{1E}$ of character pattern #1 exposed earlier to the shot start position $P_{2S}$ of character pattern #2 to be exposed next, a very large amount of deflection is required.

At this time, in the case of deflecting a long distance such that there is exceeded a presumed deflection distance when the stabilization time of the sub-deflection amplifier is determined, a shot is carried out before the deflection amplifier is defined. Thus, the position of a character pattern exposed is dislocated or deformation occurs. Because of this, there is a problem that the exposure precision is degraded. This phenomenon may occur even within the presumed deflection distance, depending on the degree of adjustment of a deflection circuit even without being limited to the above described case.

Figure 17A:
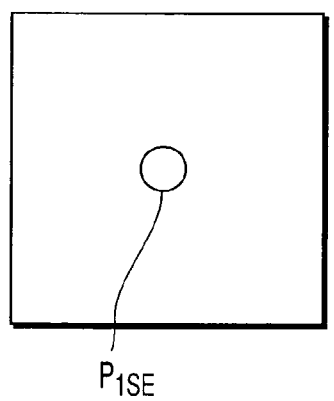
FIG. 17A is a plan view showing an exposure start/end position $P_{1SE}$ of the character pattern #1 according to a sixth embodiment of the present invention.
Figure 17B:
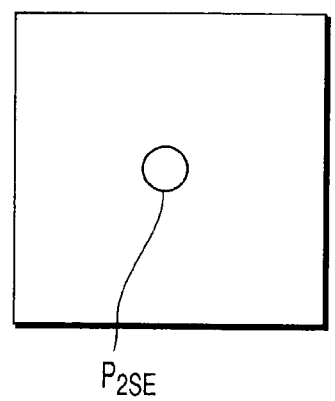
FIG. 17B is a plan view showing an exposure start/end position $P_{2SE}$ Of the character pattern #2 according to the sixth embodiment.

In the present embodiment, as shown in FIG. 17A and FIG. 17B, the start and end positions $P_{1SE}$, $P_{2SE}$ of all the character patterns are set based on two exposure positions proximal to the center of the sub field area that is a position at which the deflection quantity of electron beam by the sub-deflector is 0. Then, the character pattern exposure sequence is determined so that the deflection path connecting these two points to each other is the shortest. FIG. 17A is a plan view showing the exposure start/end position $P_{1SE}$ of character pattern #1 according to a sixth embodiment. FIG. 17B is a plan view showing the exposure start/end position $P_{2SE}$ of character pattern #2 according to the sixth embodiment.

For the selection sequence of character openings on the CP aperture, as described in the first embodiment, the character openings are sequentially selected while the electron beam is deflected on the CP aperture mask in a deflection path with the shortest distance, of the deflection paths passing the character openings to be used one time.

Figure 18:
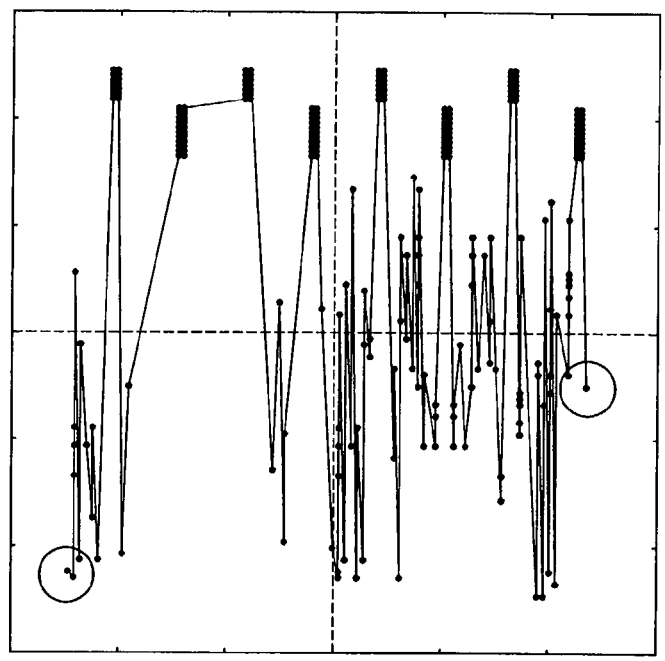
FIG. 18 is a view showing an exposure sequence of the character pattern #1 in a prior art.
Figure 19:
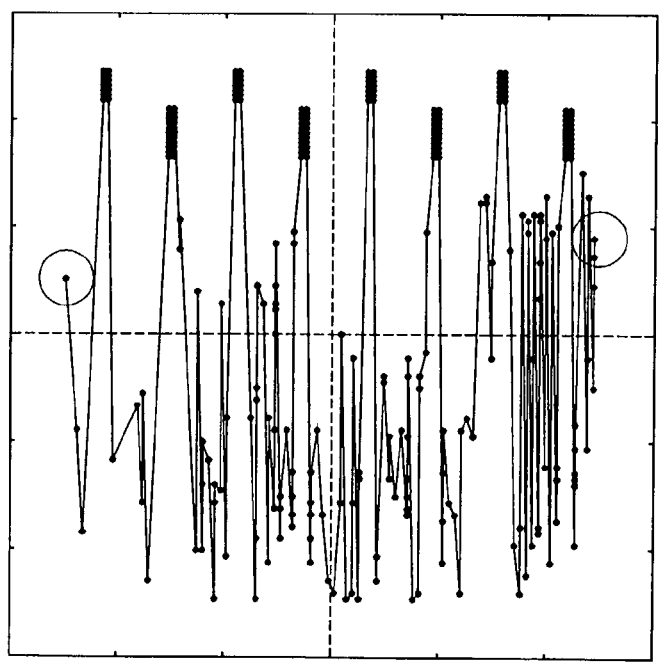
FIG. 19 is a view showing an exposure sequence of the character pattern #2 in a prior art.

In converting pattern data on a circuit pattern of a semiconductor device by using a program for producing exposure pattern data to be inputted to a general exposure apparatus, when a shot position of one character pattern #1 in a certain sub field area is connected to another in accordance with the exposure sequence of exposure data, the result as shown in FIG. 18 is obtained. The size of the sub field area is 50 μm². In the sub field area, the coordinate of the shot position of a character pattern is relatively expressed by a diagonal coordinate in which the center of each sub field area is defined as an origin. The exposure end position is a (x, y, z) coordinate expressed as (23, 45, −5.03) (in units of μm). With respect to character pattern #2 to be exposed following this character pattern #1 as well, when a shot position is connected to another in accordance with the exposure sequence as in character pattern #1, the result as shown in FIG. 19 is obtained.

The exposure start position of character pattern #2 is obtained as (−24, 87, 5.03) when it is expressed in the relative coordinate similarly.

Therefore, when a character pattern to be exposed on a substrate is changed from character pattern #1 to character pattern #2, in order to carrying out a first character pattern shot in character pattern #2, it is required to deflect an electron beam by means of the sub-deflector by −48.32 μm in the "x" direction and by +10.08 μm in the "y" direction. Namely, the deflection quantity of 49.3 μm in total is obtained, requiring deflection from one end to the other end of a substantially diagonal side. In contrast, in the method according to the present embodiment, two character patterns are selected such that the shot position of each character pattern is proximal to the center of the sub field area. These two patterns are determined so as to be at the exposure start position and the exposure end position of the character pattern in each sub field area.

Next, in accordance with the determined shot start and end positions with respect to each character pattern, the character pattern exposure sequence is determined so that a distance connecting all the character patterns to each other in each sub field area is the shortest. At this time, an algorithm for the Travelling Salesman Problem is used to determine the character pattern exposure sequence, and the sequence determined thereby is employed as an exposure sequence when the shortest distance is obtained as a pseudo optimal solution.

Figure 20:
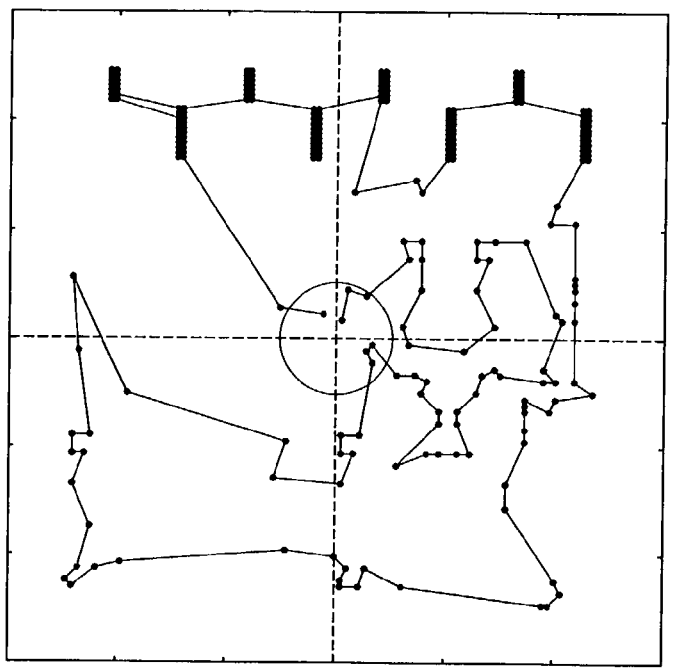
FIG. 20 is a view showing an exposure sequence of the character pattern #1 according to the sixth embodiment.
Figure 21:
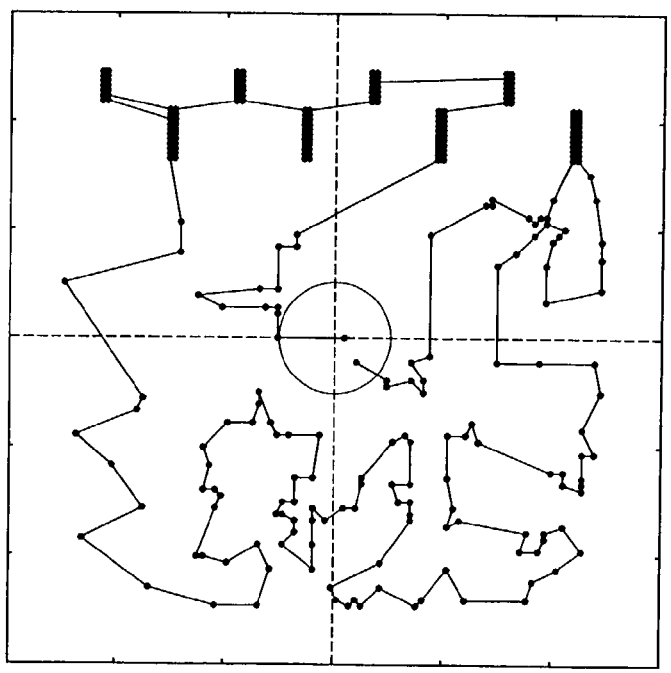
FIG. 21 is a view showing an exposure sequence of the character pattern #2 according to the sixth embodiment.

FIG. 20 and FIG. 21 each show that the exposure sequence of the character patterns #1 and #2 is thus determined, and the shot positions of the character patterns are connected to each other in accordance with the exposure sequence. The final shot position of character pattern #1 is (−1, 19, 2.25), and the shot start position of character pattern #2 is (0, 89, 0.01). That is, according to the start and end positions of the shot of each character pattern determined in this method, the deflection quantity of electron beam after character pattern #1 has been changed to character pattern #2 is 2.08 μm in the "x" direction and −2.24 μm in the "y" direction, and a total of the deflection quantity is 3.06 μm.

In this case, in electron beam exposure of the two character patterns #1 and #2, after the completion of exposure of character pattern #1, the quantity obtained when the electron beam is deflected by means of the sub-deflector in order to carry out a first character pattern shot in character pattern #2 is −48.32 μm in the "x" direction and +10.08 μm in the "y" direction in exposure data produced in a general method. That is, a total of deflection quantity is 49.36 μm.

In contrast, the exposure start and end positions of each character pattern are set near the center of the sub field area, whereby the electron beam deflection quantity when exposure of character pattern #1 is changed to exposure of character pattern #2 is 2.08 μm in the "x" direction and −2.24 μm in the "y" direction, and a total of deflection quantity is 3.06 μm. Therefore, in the method according to the present embodiment, the electron beam deflection quantity of the sub-deflector in moving the inside of the sub field area can be reduced significantly.

The center of the sub field area is defined as a position at which the electron beam deflection quantity by the sub-deflector is 0. The shot start and end positions are set near the position at which the deflection quantity is 0. Accordingly, the deflection voltage of the sub-deflector is reduced when exposure of character pattern #1 is changed to exposure of character pattern 2, making it possible to improve positional precision of the exposure pattern at the first exposure position of character pattern #2.

In the present embodiment, the exposure start and end positions of each character pattern are set near the center of the sub field area, whereby, even in a different sub field area, the exposure start and end positions are relatively close to each other.

As a result, in electron beam exposure of two sub field areas #1 and #2, when a sub field area to be exposed by a main-deflector is moved to sub field areas #1 and #2, an increase in quantity when an electron beam is deflected by a sub-deflector in order to carry out a first character pattern shot in the sub field area #2 can be reduced significantly as compared with a conventional method. Therefore, electron beam exposure can be carried out without degrading the exposure precision such as the pattern positional precision or pattern shape of a pattern when exposure in each sub field area is started.

As described in the present embodiment, in electron beam exposure of the two character patterns #1 and #2, when a character pattern is changed from character pattern #1 to character pattern #2, an increase in quantity when an electron beam is deflected by means of a sub-deflector in order to carry out a shot of character pattern #2 can be restricted significantly as compared with the conventional method. Thus, electron beam exposure can be carried out without degrading the exposure precision such as the pattern positional precision or pattern shape of a pattern when exposure of each sub field area is started.

Further, in the whole deflection area, the short start position and end position are set as two points which is the closest to the center of each sub field area. Thus, in all the sub field areas, the exposure sequence of a unit pattern can be determined in accordance with a predetermined method, not depending on the selection sequence of a sub field area. In addition, in the present embodiment, although the shot start and end positions of a character pattern has been set near the center of the sub field area, there is no need to always to set these positions neat the center of the area as far as the relatively same position can be specified in the sub field area.

A method for determining the exposure sequence as well is not limited to an algorithm for the Travelling Salesman Problem, and any other algorithm may be used unless a large electron beam deflection quantity between shots has been included.

SEVENTH EMBODIMENT

It is impossible to expose all the patterns in the sub field area in only the character projection scheme. Thus, pattern exposure in the sub field area is carried out by using the character projection scheme and VSB scheme altogether.

Like the shot start and end positions of a character pattern described in the sixth embodiment, the shot start and end positions in accordance with the VSB scheme in the sub field area are set based on two exposure positions whose distances are close to the center of the subsidiary defection area, and a path of a pattern connecting these two points to each other, i.e., a pattern exposure sequence is determined.

The exposure sequence is thus determined, whereby, in exposure in a single sub field area, in the case of carrying out exposure in accordance with the CP scheme following that in accordance with the VSB scheme, a distance between a position of a pattern to be lastly exposed in accordance with the VSB scheme and a position of a pattern to be first exposed in accordance with the CP scheme is reduced. Because of this, an increase in deflection quantity when an electron beam is deflected by the sub-deflector can be restricted significantly as compared with the conventional method. In addition, electron beam exposure can be carried out without degrading the exposure precision such as the positional precision or pattern shape of a pattern when exposure has been started in accordance with the CP scheme.

In exposure in a single sub field area, in the case where exposure is carried out in accordance with the VSB scheme following the CP scheme, a distance between a position of a pattern to be lastly exposed in accordance with the CP scheme and a position of a pattern to be first exposed in accordance with the VSB scheme is reduced. Because of this, an increase in deflection quantity when an electron beam is deflected by the sub-deflector can be restricted significantly as compared with the conventional method. Therefore, electron beam exposure can be carried out without degrading the exposure precision such as positional precision or pattern shape of a pattern when exposure has been started in accordance with the VSB scheme.

Further, after exposure in a single sub field area #1 has terminated, when exposure is carried out in the next sub field area #2, the exposure start position and exposure end position of a pattern to be exposed in the CP scheme and VSB scheme each is set near the relatively same position. Thus, the pattern to be lastly exposed in the sub field area #1 is close to that to be first exposed in the sub field area #1 at the relative position in each sub field area. Thus, when a sub field area to be exposed by the main-deflector is moved, an increase in deflection quantity when an electron beam is deflected by the sub-deflector in order to carry out first pattern exposure in the sub field area can be restricted significantly as compared with the conventional method. Therefore, electron beam exposure can be carried out without degrading the exposure precision such as positional precision or pattern shape of a pattern when exposure has been started in the sub field area #2.

For the selection sequence of character openings on the CP aperture, as described in the first embodiment, the character openings are sequentially selected while an electron beam is deflected by a deflection path with the shortest distance, of the deflection paths passing through the respective character openings to be used one time.

In exposing the pattern in each sub field area, no restriction applies to the sequence between the pattern to be exposed in accordance with the CP scheme and the pattern to be exposed in accordance with the VSB scheme. However, as described in the third embodiment, in exposing the pattern in each sub field area, it is preferable that the pattern to be exposed in accordance with the VSB scheme be preferentially exposed, and then, the pattern to be exposed in the CP scheme be exposed.

EIGHTH EMBODIMENT

In each sub field area, pattern exposure may be carried out in the VSB scheme only. In this case as well, the shot start and end positions in accordance with the VSB scheme in each sub field area are set based on two exposure positions whose distances are close to the center of the sub field area, and a path of a pattern connecting these two points to each other, i.e., a pattern exposure sequence is determined.

After exposure in a single sub field area #1 has terminated, when exposure is carried out in the next sub field area #2, the exposure start position and exposure end position of a pattern in each sub field area are set near the relatively same position. Thus, the pattern to be lastly exposed in the sub field area #1 is close to that to be first exposed in the sub field area #1 at the relative position in each sub field area. Thus, when a sub field area in which exposure is carried out by the main-deflector is moved, an increase in deflection quantity when an electron beam is deflected by the sub-deflector in order to carry out first pattern exposure in the sub field area can be restricted significantly as compared with the conventional method. Therefore, electron beam exposure can be carried out without degrading the exposure precision such as positional precision or pattern shape of a pattern when exposure has been started in the sub field area #2.

The present invention is not limited to the above described embodiments each, and can be variously modified at a stage at which the invention is embodied without departing from the spirit of the invention. Further, the inventions at a variety of stages are included in the above described embodiments, and a variety of inventions can be excerpted according to a proper combination of a plurality of constituent elements to be disclosed. For example, even if some of all the constituent elements disclosed in the embodiments are deleted, in the case where the problems described in the BACKGROUND OF THE INVENTION section can be solved, and the advantageous effect described in the DETAILED DESCRIPTION OF THE INVENTION section is achieved, an arrangement from these constituent elements have been deleted can be excerpted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam exposure method for exposing a predetermined pattern by irradiation of a charged particle beam for each deflection area in which a charged particle beam can be irradiated by deflection of the charged particle beam, the exposure method comprising:
    placing an aperture mask having a plurality of character openings in an exposure apparatus that includes a shaping deflector which deflects the charged particle beam on the aperture mask and an irradiation positioning deflector which deflects the charged particle beam shaped by the character opening on a sample;
    applying a first voltage to the shaping deflector, the first voltage deflects the charged particle beam at an first character opening;
    sequentially exposing all the character patterns which can be exposed by a first character beam which is the charged particle beam shaped by the first character opening in the deflection area after a stabilization time set as a function of a shaping deflection voltage that is applied to the shaping deflector has elapsed after applying the first voltage;
    applying a second voltage to the shaping deflector after all the character patterns in the deflection area have been exposed by the first character beam, the second voltage deflects the charged particle beam at a second character opening which is a next character opening of the first character opening;
    sequentially exposing all the character patterns which can be exposed by a second character beam which is the charged particle beam shaped by the second character opening in the deflection area after the stabilization time set as a function of the shaping deflection voltage has elapsed after applying the second voltage;
    wherein the charged particle beam is deflected at a predetermined deflection path in which a charged particle beam selects each of the character openings for use in exposure in the deflection area; and
    wherein the predetermined deflection path is a deflection path with the shortest distance, of the deflection paths in which the charged particle beam passes through the respective character openings one time.

2. A charged particle beam exposure method according to claim 1 wherein the predetermined deflection path is determined by using an algorithm for solving a Travelling Salesman Problem.

3. A charged particle beam exposure method according to claim 1, wherein the exposing the character patterns which can be exposed by a character beam which is the charged particle beam shaped by the character opening in the deflection area is carried out deflecting the charged particle beam at a deflection path with the shortest distance, of the deflection paths passing through the respective exposure positions of the character pattern one time.

4. A charged particle beam exposure method according to claim 3, wherein the deflection path of the character beam is determined by using an algorithm for solving a Travelling Salesman Problem.

5. A charged particle beam exposure method according to claim 3, wherein among the exposing the character patterns which can be exposed by the character beam, an exposure start position and an exposure end position of the character pattern are selected from among two exposure positions close to a predetermined position in the deflection area.

6. A charged particle beam exposure method according to claim 5, wherein the predetermined position is a relatively identical position in each deflection area.

7. A charged particle beam exposure method according to claim 5, wherein the predetermined position is an irradiation position of the character beam on the sample when a deflection quantity of the character beam by the irradiation position deflector is 0.

8. A charged particle beam exposure method according to claim 7, wherein the irradiation position of the character beam on the sample is a center of the deflection area.

9. A charged particle beam exposure method according to claim 1, wherein, in a pattern free of being exposed in accordance with the character projection scheme for exposing by a charged particle beam shaped by the character opening in the predetermined pattern, exposing in accordance with a variable shaping beam scheme for sequentially exposing unit patterns by a VSB beam which is the charged particle beam in a unit graphics shape, and exposing in accordance with one exposure scheme, followed by exposing in accordance with the other exposure scheme.

10. A charged particle beam exposure method according to claim 9, wherein exposing in accordance with the character projection scheme after has been exposed in the variable shaping beam scheme.

11. A charged particle beam exposure method according to claim 10, wherein, in exposure in accordance with the variable shaping beam method, the VSB beam is deflected at a deflection path with the shortest distance of the deflection paths each passing through exposure positions of the unit pattern, and the unit patterns each are sequentially exposed.

12. A charged particle beam exposure method according to claim 11, wherein a deflection path of the VSB beam is determined by using an algorithm for solving a Travelling Salesman Problem.

13. A charged particle beam exposure method for exposing a predetermined pattern by irradiation of a charged particle beam for each deflection area in which a charged particle beam can be irradiated by deflection of the charged particle beam, the exposure method comprising:

placing an aperture mask having a plurality of character openings in an exposure apparatus which includes a shaping deflector which deflects the charged particle beam on the aperture mask and an irradiation positioning deflector which deflects on a sample the charged particle beam shaped by the character opening;

applying a first voltage to the shaping deflector, the first voltage deflects the charged particle beam at an first character opening;

sequentially exposing all the character patterns which can be exposed by a character beam which is the charged particle beam shaped by the first character opening in the deflection area after applying the first voltage;

applying a second voltage to the shaping deflector, after all the character patterns in the deflection area has been exposed by the first character beam, and then, deflecting the charged particle beam at a second character opening which is used in next exposure;

sequentially exposing all the character patterns which can be exposed by a second beam shaped by the second character opening in the deflection area after applying the second voltage, wherein the charged particle beam is deflected at a predetermined deflection path in which the charged particle beam selects each character opening for use in exposure in the deflection area one time, and an exposure start position and an exposure end position of a character pattern which can be exposed by a character beam shaped by the one character opening are selected from among two exposure positions close to a center of the deflection area.

14. A charged particle beam exposure method according to claim 13, wherein the predetermined position is a relatively identical position in each deflection area.

15. A charged particle beam exposure method according to claim 13, wherein the predetermined position is an irradiation position of the charged particle beam on the sample when a deflection quantity of the irradiation positioning deflector is 0.

16. A charged particle beam exposure method according to claim 13, wherein the irradiation position of the character beam on the sample is a center of the deflection area.

17. A charged particle beam exposure method according to claim 13, wherein, in a pattern free of being exposed in accordance with a character projection scheme for exposing by a charged particle beam shaped at the character opening in the predetermined pattern, exposing in accordance with a variable shaping beam scheme for sequentially exposing unit patterns by a VSB beam which is the charged particle beam shaped a unit graphics shape, and exposing in accordance with one exposure scheme, followed by exposing in accordance with the other exposure scheme.

18. A charged particle beam exposure method for exposing a predetermined pattern by irradiation of a charged particle beam for each deflection area in which a charged particle beam can be irradiated by deflection of the charged particle beam, the exposure method comprising:

placing a sample in an exposure apparatus which includes an irradiation positioning deflector by which a VSB beam which is the charged particle beam shaped in a basic unit graphics is deflected on the sample;

applying a first voltage to the irradiation positioning deflector, the first voltage deflects the charged particle beam at a predetermined exposure position in the deflection area;

exposing a unit pattern at a predetermined exposure position by using the VSB beam after a stabilization time set as a function of a deflection voltage that is applied to the irradiation positioning deflector has elapsed after applying the first voltage;

applying a second voltage to the irradiation positioning deflector after exposure at the predetermined position has terminated, the second voltage deflects the VSB beam at a next exposure position of the predetermined exposure position in the deflection area; and exposing a unit pattern at the next exposure position by using the VSB beam after a stabilization time set as a function of a deflection voltage which is applied to the irradiation positioning deflector has elapsed after applying the second voltage, wherein, in the deflection area, the VSB beam is deflected at a deflection path with the shortest distance, of the deflection paths each passing one time an exposure position of a unit pattern to be exposed by the charged particle beam shaped in the basic unit graphics.

19. A charged particle beam exposure method according to claim 18, wherein a deflection path of the VSB beam is determined by using an algorithm for solving a Travelling Salesman Problem.

20. A charged particle beam exposure method according to claim 18, wherein an exposure start position and an exposure end position of the VSB beam are selected from among two exposure positions close to a predetermined position in the deflection area.

21. A charged particle beam exposure method according to claim 20, wherein the predetermined position is a relatively identical position in each deflection area.

22. A charged particle beam exposure method according to claim 20, wherein the predetermined position is an irradiation position of the VSB beam on the sample when a deflection quantity of the irradiation positioning deflector is 0.

23. A charged particle beam exposure method according to claim 22, wherein the irradiation position of the VSB beam on the sample is a center of the deflection area.

24. A charged particle beam exposure method for exposing at a plurality of positions by using a VSB beam which is a charged particle beam shaped in a unit graphics for each deflection area in which the VSB beam can be irradiated by deflection of the VSB beam, thereby exposing a predetermined pattern on a sample, wherein an exposure start position and an exposure end position of the VSB beam are selected from among two exposure positions close to a center of the deflection area.

25. A charged particle beam exposure method according to claim 24, wherein the predetermined position is a relatively identical position in each deflection area.

26. A charged particle beam exposure method according to claim 25, wherein an exposure start position and an exposure end position of the VSB beam in the basic unit graphics shape are selected from among two exposure positions close to the predetermined position.

27. A charged particle beam exposure method according to claim 24, wherein the predetermined position is an irradiation position of the VSB beam on the sample when a deflection quantity of a deflector which deflects the VSB beam on the sample is 0.

28. A charged particle beam exposure method according to claim 27, wherein the irradiation position of the VSB beam on the sample is a center of the deflection area.

29. A charged particle beam exposure method for exposing a predetermined pattern by irradiation of a charged particle beam for each deflection area in which a charged particle beam can be irradiated by deflection of the charged particle beam, the exposure method comprising:
    placing an aperture mask having a plurality of character openings in an exposure apparatus that includes a shaping deflector which deflects the charged particle beam on the aperture mask, and an irradiation positioning deflector which deflects the charged particle beam shaped by the character opening on a sample;
    preparing exposure data used for exposure in a character projection method, the exposure data having described information corresponding to: a predetermined deflection path in which a charged particle beam selects one time a character opening for use in exposure in a deflection area of the sample; and an exposure position and/or sequence of the character patterns in the deflection area capable of being exposed in accordance with the selected character opening;
    applying a voltage to the shaping deflector based on the exposure data, to deflect the charged particle beam at a character opening formed at the aperture mask;
    deflecting by the deflector the charged particle beam shaped through the character opening based on the exposure data, after a stabilization time set as a function of a shaping deflection voltage that is applied to the shaping deflector has elapsed after applying the first voltage, followed by sequentially exposing all the character patterns in the deflection area;
    wherein the charged particle beam is deflected at a predetermined deflection path in which a charged particle beam selects each of the character openings for use in exposure in the deflection area; and
    wherein the predetermined deflection path is a deflection path with the shortest distance, of the deflection paths in which the charged particle beam passes through the respective character openings one time.

30. A method for generating charged particle beam exposure data comprising:
    dividing pattern data for which exposing with a charged particle beam into a plurality of deflection areas, with respect to each deflection area, referring to location information of a character opening located at an aperture mask, followed by dividing the pattern data into a pattern in which exposing in accordance with a variable shaping beam scheme and a pattern in which exposing in accordance with a character projection scheme and selecting a character opening for use in exposure in accordance with the character projection scheme;
    dividing the pattern in which exposing in accordance with the variable shaping beam into a plurality of unit patterns being a unit in which exposing, with respect to each deflection area;
    obtaining a path with the shortest distance from the paths each passing through the each divided pattern one time, with respect to each deflection area;
    determining an exposure sequence of a unit pattern based on the obtained path, followed by producing shot data on a pattern to be exposed in accordance with the variable shaping beam scheme, with respect to each deflection area;
    obtaining a path with the shortest distance from the paths each passing through each character opening one time based on a location information on selected character openings, with respect to each deflection area;
    determining a selection sequence of the character openings based on the obtained path, with respect to each deflection area;
    obtaining a path with the shortest distance from the paths each passing through each patterns one time, the each patterns to be exposed by the charged particle beam shaped the one character opening, with respect to each character openings of each of the deflection areas;
    determining an exposure sequence of the character patterns based on the obtained path, with respect to each deflection area; and
    producing shot data on a pattern to be exposed in accordance with the character projection scheme from the selection sequence of the character openings and the exposure sequence of the character patterns; and
    producing a charged particle beam exposure data which being integrated with the shot data in accordance with the variable shaping beam scheme and the shot data in accordance with the character projection scheme so that a pattern in accordance with the character projection scheme is exposed next to a pattern in accordance with the variable shaping beam scheme, with respect to each deflection area.

31. A method for producing charged particle beam exposure data according to claim 30, wherein the exposure sequence of unit patterns in the deflection area, the selection sequence of the character openings, and the exposure sequence of the character patterns are determined by using an algorithm for solving a Travelling Salesman Problem.

32. A method for producing charged particle beam exposure data according to claim 30, wherein, in determining the exposure sequence of the character patterns, an exposure start position and an exposure end position of a character pattern are selected from among two exposure positions close to a predetermined position in a deflection area.

33. A method for producing charged particle beam exposure data comprising:
    dividing pattern data for which exposing with a charged particle beam into a plurality of deflection areas;
    dividing the pattern data into patterns in which exposing in accordance with a character projection scheme based on a location information on character openings located in an aperture mask, and selecting a character opening for use in exposure in accordance with the character projection scheme, with respect to each deflection area;
    determining the exposure sequence of character patterns each in which an exposure start position and an exposure end position are selected from among two exposure positions close to a center of a deflection area, with respect to each deflection area; and
    producing charged particle beam exposure data based on the exposure sequence of the determined character patterns.

* * * * *

UNITED STATES PATENT AND TRADEMARK OFFICE
CERTIFICATE OF CORRECTION

| | | |
|---|---|---|
| PATENT NO. | : 7,102,147 B2 | Page 1 of 1 |
| APPLICATION NO. | : 10/255830 | |
| DATED | : September 5, 2006 | |
| INVENTOR(S) | : Inanami et al. | |

It is certified that error appears in the above-identified patent and that said Letters Patent is hereby corrected as shown below:

Title page, item (57), in the Abstract, line 2, change "an mask" to --a mask--.

Title page, item (57), in the Abstract, line 3, change "including" to --includes--.

Title page, item (57), in the Abstract, line 5, change "an first" to --a first--.

Claim 1, column 21, line 50, change "an first to --a first--.

* Claim 2, column 22, line 14, change "claim 1" to --claim 1,--.

Claim 10, column 22, line 59, change "exposing in" to --exposing is in--.

Claim 10, column 22, line 60, change "after has" to --after it has--.

Claim 13, column 23, line 17, change "an first" to --a first--.

Claim 13, column 23, line 24, change "has been" to --have been--.

Claim 30, column 26, line 14, change "patterns" to --pattern--.

Claim 30, column 26, lines 15, change "patterns" to --pattern--.

Claim 30, column 26, line 16, after "shaped", insert --by--.

Claim 30, column 26, line 17, change "openings" to --opening--.

Signed and Sealed this

Nineteenth Day of December, 2006

JON W. DUDAS
*Director of the United States Patent and Trademark Office*